United States Patent [19]
Arase et al.

[11] Patent Number: 6,091,666
[45] Date of Patent: Jul. 18, 2000

[54] NONVOLATILE FLASH MEMORY WITH FAST DATA PROGRAMMING OPERATION

[75] Inventors: Kenshiro Arase; Toshinobu Sugiyama; Masanori Noda, all of Kanagawa, Japan

[73] Assignee: Sony Corporation, Japan

[21] Appl. No.: 08/941,920

[22] Filed: Oct. 1, 1997

[30] Foreign Application Priority Data

Oct. 4, 1996 [JP] Japan ................................ P08-264475
Dec. 9, 1996 [JP] Japan ................................ P08-328894

[51] Int. Cl.[7] ........................................................ G11C 7/00
[52] U.S. Cl. ............................. 365/238.5; 365/189.05; 365/233; 365/230.08; 365/189.01; 365/239
[58] Field of Search ......................... 365/189.01, 230.01, 365/189.05, 233, 230.08, 239, 238.5

[56] References Cited

U.S. PATENT DOCUMENTS

| | | | |
|---|---|---|---|
| 5,297,029 | 3/1994 | Nakai et al. ........................ | 365/238.5 |
| 5,355,347 | 10/1994 | Cioaca ................................ | 365/230.08 |
| 5,490,110 | 2/1996 | Sawada et al. ..................... | 365/185.03 |
| 5,751,637 | 5/1998 | Chen et al. ......................... | 365/185.33 |
| 5,778,440 | 7/1998 | Yiu et al. ............................ | 711/154 |

Primary Examiner—Viet Q. Nguyen
Attorney, Agent, or Firm—Rader, Fishman & Grauer; Ronald P. Kananen

[57] ABSTRACT

A semiconductor nonvolatile memory device wherein memory transistors in which data is electrically programmed in units of pages by performing the data programming together for selected memory transistors of a sector selected in response to page program data in units of sectors are arranged in the form of a matrix, provided with a means for continuously inputting the page program data of a plurality of page areas in synchronization with a constant clock pulse and continuously performing the page programming according to the plurality of page program data.

17 Claims, 17 Drawing Sheets

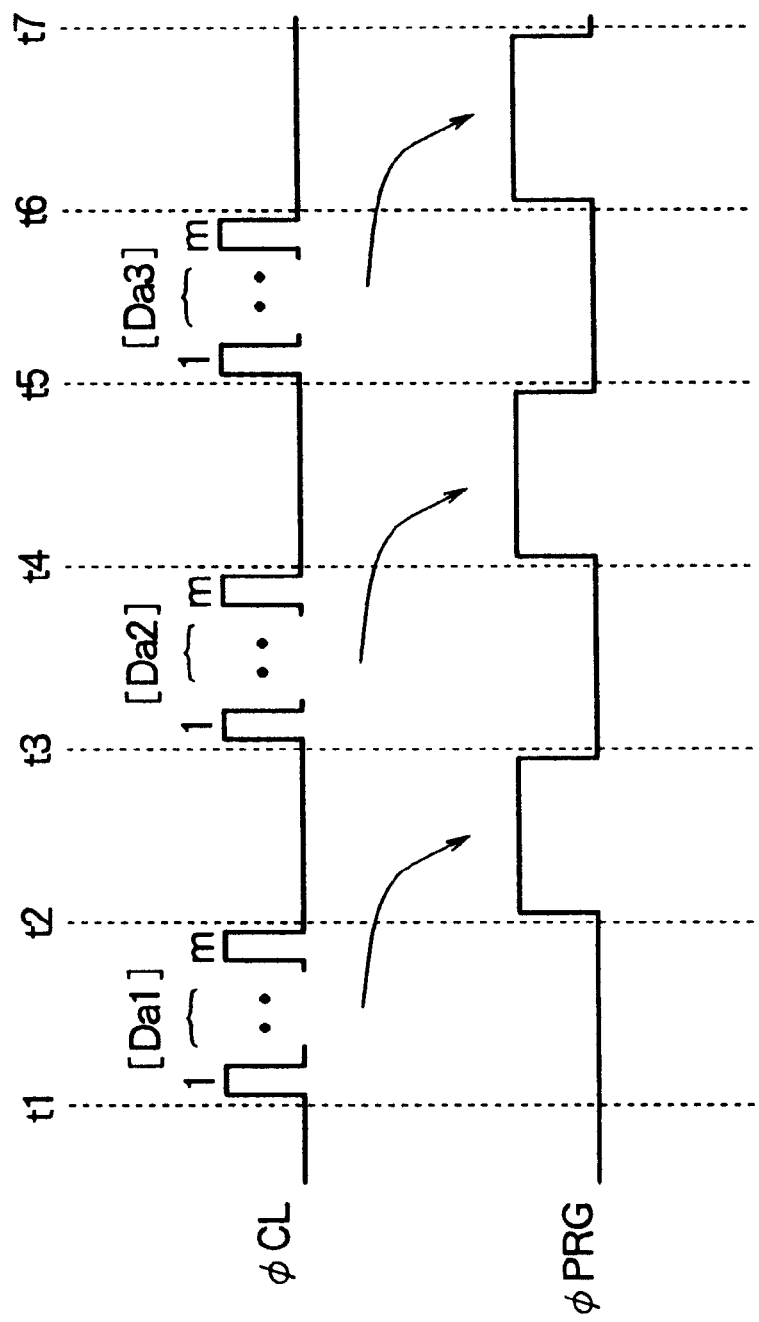

FIG. 12A  φCL
FIG. 12B  φCL'
FIG. 12C  φ1a
FIG. 12D  φ2a
FIG. 12E  φCLT
FIG. 12F  φPRG

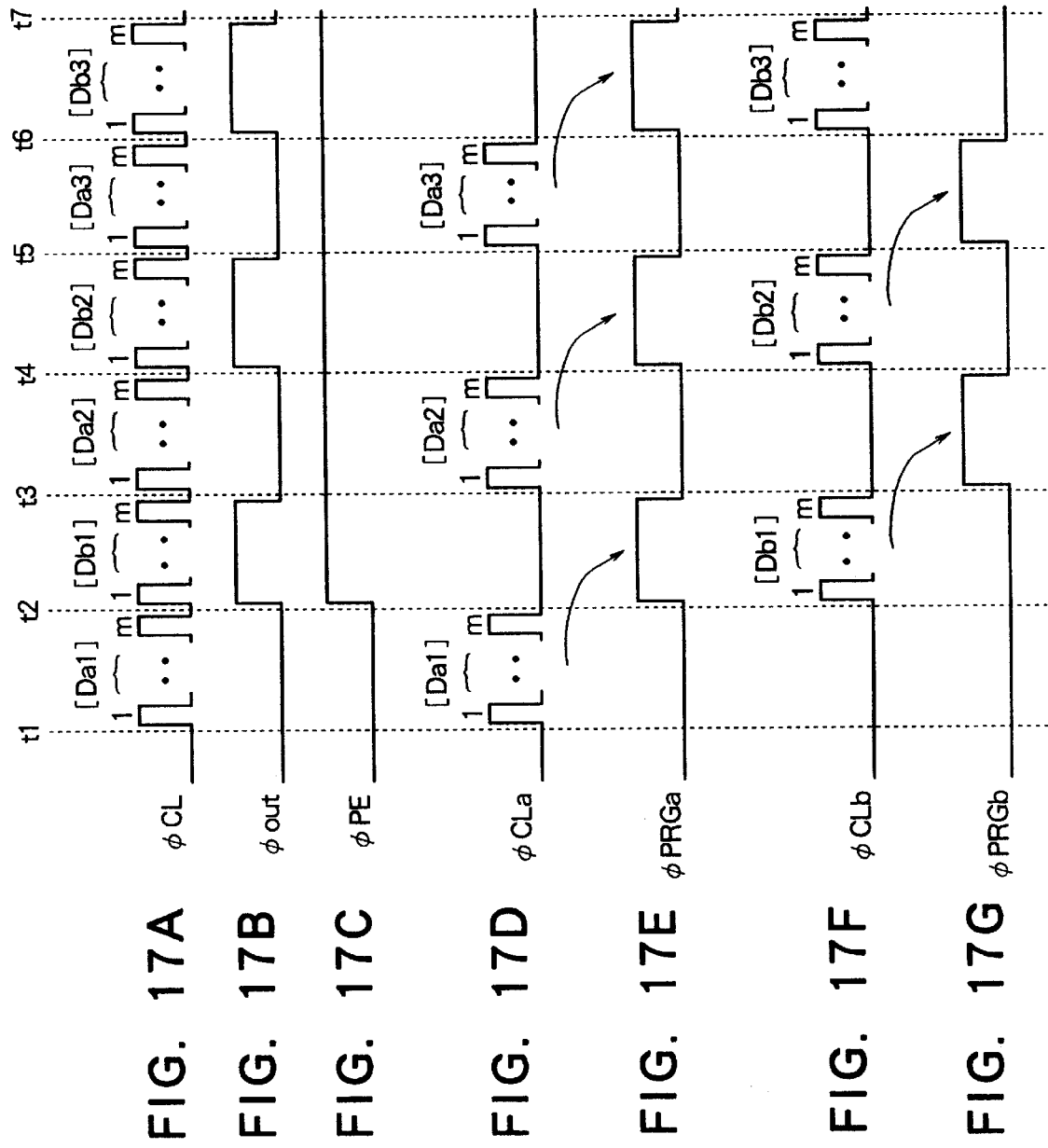

NONVOLATILE FLASH MEMORY WITH FAST DATA PROGRAMMING OPERATION

BACKGROUND OF THE INVENTION

1. Field of the Invention

The present invention relates to a semiconductor nonvolatile memory device for performing page programming in units of word lines such as a NAND type flash memory, more particularly relates to an increase of speed of data programming.

2. Description of the Related Art

In the semiconductor nonvolatile memory device such as a NAND type flash memory and DINOR type flash memory, data programming is carried out together for all memory transistors connected to a selected word line.

Namely, the page programming is carried out in units of word lines.

FIG. 1A and FIG. 1B are views of the structure of a memory array in a NAND type and DINOR type flash memory.

The NAND type flash memory of FIG. 1A is, for convenience, shown as a memory array where four memory transistors are connected to one NAND string connected to one bit line.

In FIG. 1A, BL denotes a bit line. A NAND string in which two selection transistors ST1 and ST2 and four memory transistors MT1 to MT4 are connected in series is connected to the bit line BL.

The selection transistors ST1 and ST2 are respectively controlled by selection gate lines SL1 and SL2, while the memory transistors MT1 to MT4 are respectively controlled by word lines WL1 to WL4.

The DINOR type flash memory of FIG. 1B is, for convenience, shown as a memory array where four memory transistors are connected to one sub-bit line connected to one main bit line.

In FIG. 1B, MBL denotes the main bit line, and SBL denotes the sub-bit line. The main bit line MBL and the sub-bit line SBL are connected via the selection transistor ST1 controlled by the selection gate line SL.

The sub-bit line SBL intersects with four word lines WL1 to WL4. Four memory transistors MT1 to MT4 are arranged at intersection positions.

In a semiconductor nonvolatile memory device for performing page programming in units of word line sectors such as a NAND type and DINOR type flash memory, the programming of the data is carried out as follows.

Namely, data programming is performed by providing a data latch circuit for temporarily latching the page program data for every bit line (or main bit line) and continuously performing two steps, that is, a data transfer step for transferring the page program data to the data latch circuit and a data programming step for performing page programming together for memory transistors connected to the selected word line according to the page programming data.

FIG. 2 shows a timing chart of a semiconductor nonvolatile memory device for performing conventional page programming in units of line sectors, for example, a NAND type flash memory, at the time of data programming.

In FIG. 2, the period from the time t1 to time t3 is a step for performing the first page programming.

First, at the times t1 to t2, the first page program data [Da1]1 to [Da1]m are transferred to the data latch circuit of each bit line in synchronization with a data transfer clock signal ΦCL. Here, in the case of a general NAND type flash memory, usually the page size is 512 bytes. Also, the data transfer is carried out in units of bytes, so the number of data transfer clock signal ΦCL pulses is generally represented by m=512.

Next, at the times t2 to t3, in synchronization with the data program signal ΦPRG, the page programming for the first page program data [Da1]1 to [Da1]m is carried out together for the memory transistors connected to the first selected word line.

Similarly, the term from the times t3 to t5 is a step for performing a second page programming. The page programming is carried out for the second page program data [Da2]1 to [Da2]m together for the memory transistors connected to the second selected word line.

Similarly, the term from the times t5 to t7 is a step for performing a third page programming. The page programming is carried out for the third page program data [Da3]1 to [Da3]m together for the memory transistors connected to the third selected word line.

In the data programming operation of such a conventional NAND type flash memory, the data programming for every page is carried out by dividing the operation into two steps, that is, the data transfer step and the data programming step.

In the case of a general NAND type flash memory, the data transfer clock signal ΦCL is driven 512 times by a burst pulse of about 100 nanoseconds, therefore the time required for the data transfer is about 50 microseconds.

On the other hand, in the case of the general NAND type flash memory, the time required for one page worth of the data programming is about 200 microseconds since the data programming is carried out by applying a few pulses of about 40 microseconds.

Accordingly, in the case of a conventional NAND type flash memory, the time required for the transfer of the program data constitutes a remarkably long time with respect to the actual data programming time, so the substantial data programming speed is sacrificed.

Further, along with the increase of the capacity of NAND type flash memories in the future, there is a possibility that the page size will become larger. In this case, it is believed that the actual data programming time and the time required for the transfer of the program data will become almost equal.

Further, in the case of a conventional NAND type flash memory, when the page programming is continuously carried out over a plurality of page areas like when recording for example image information data, it is impossible to transfer a plurality of page program data to the NAND type flash memory in synchronization with continuous burst pulses. It is necessary to divide the data into each page program data for transfer.

In the case of a general NAND type flash memory, the page program data is divided and transferred under the control of an external controller.

Accordingly, there is a problem that the data programming operation cannot be carried out unless under the control of an external controller.

SUMMARY OF THE INVENTION

The present invention was made in consideration with such a circumstance and has as an object thereof to provide a semiconductor nonvolatile memory device capable of increasing the speed of the data programming and further capable of performing the data programming without being controlled by an external controller.

To attain the above object, the present invention provides a semiconductor nonvolatile memory device wherein memory transistors in which data is electrically programmed in units of pages by performing data programming together for all memory transistors of the sector selected in response to the page program data in units of sectors are arranged in the form of a matrix, provided with a means for continuously inputting the page program data of a plurality of page areas in synchronization with a constant clock pulse and continuously performing the page programming according to the plurality of page program data.

More specifically, the semiconductor nonvolatile memory device of the present invention is a semiconductor nonvolatile memory device wherein memory transistors in which data is electrically programmed in units of pages by performing the data programming together for all memory transistors of a sector selected in response to the page program data in units of sectors are arranged in the form of a matrix, provided with a first data latch circuit and a second data latch circuit provided as a pair for every bit line; a means for continuously inputting the page program data of a plurality of page areas by alternately dividing the same into a first page program data and a second page program data; a first page data programming means for transferring the first page program data to the first data latch circuit and performing the page programming according to the data latched in the first data latch circuit; a second page data programming means for transferring the second page program data to the second data latch circuit and performing the page programming according to the data latched in the second data latch circuit; and a means for repeatedly performing the data programming operation of the first page data programming means and the data programming operation of the second page data programming means in parallel to each other.

Alternatively, the semiconductor nonvolatile memory device of the present invention is provided with a first memory array and a second memory array wherein memory transistors in which the data is electrically programmed in units of pages by continuously performing the data transfer step for transferring the page program data in units of word lines to a data latch circuit provided for every bit line and a data programming step for performing the page programming together for the memory transistors connected to the selected word line according to the page program data are arranged in the form of matrix and a means for performing the data programming with respect to the first memory array and the second memory array in parallel by alternately repeatedly performing the step of simultaneously performing the data transfer with respect to the first memory array and the data programming with respect to the second memory array and the step of simultaneously performing the data transfer with respect to the second memory array and the data programming with respect to the first memory array.

Next, the data transfer of the page program data to the first memory array and the data transfer of the page program data to the second memory array are continuously carried out in synchronization with a constant clock pulse.

According to the semiconductor nonvolatile memory device of the present invention, the data transfer operation and the data programming operation are carried out alternately and then in parallel.

Accordingly, data programming at a speed of two times the usual speed becomes possible.

BRIEF DESCRIPTION OF THE DRAWINGS

These and other objects and features of the present invention will become clearer from the following description of the preferred embodiments made with reference to the attached drawings, in which:

FIGS. 2A and 2B are views of a timing chart of the data programming operation of a semiconductor nonvolatile memory device for performing data programming using a conventional word line sector as a unit;

FIGS. 17A–17G are views of the timing chart of the data programming operation in the semiconductor nonvolatile memory device of FIG. 15.

DESCRIPTION OF THE PREFERRED EMBODIMENTS

First Embodiment

Figure 1B:
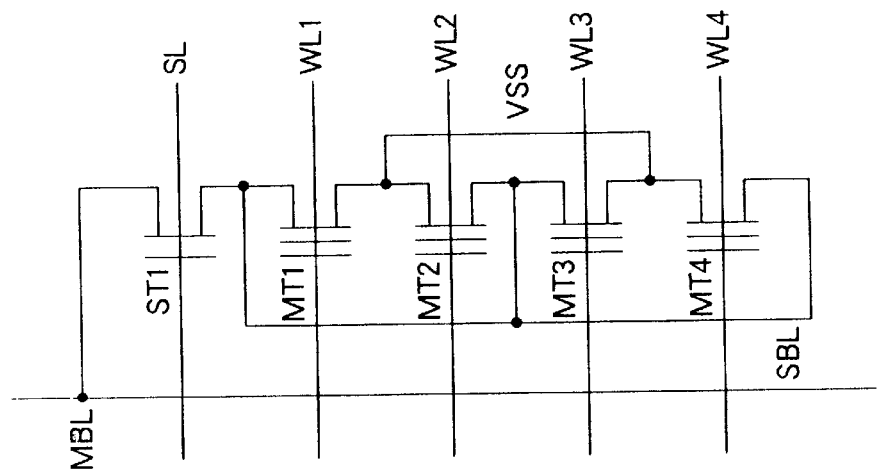
FIGS. 1A and 1B are views showing the memory array structures in NAND type and DINOR type flash memories.
Figure 1A:
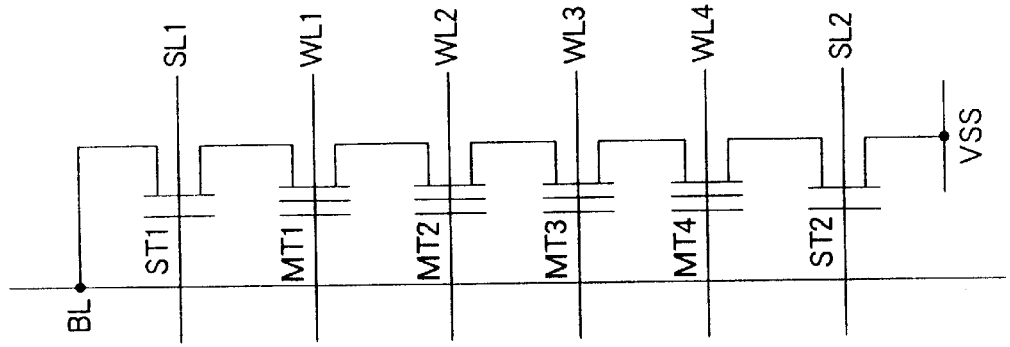
Figure 3:
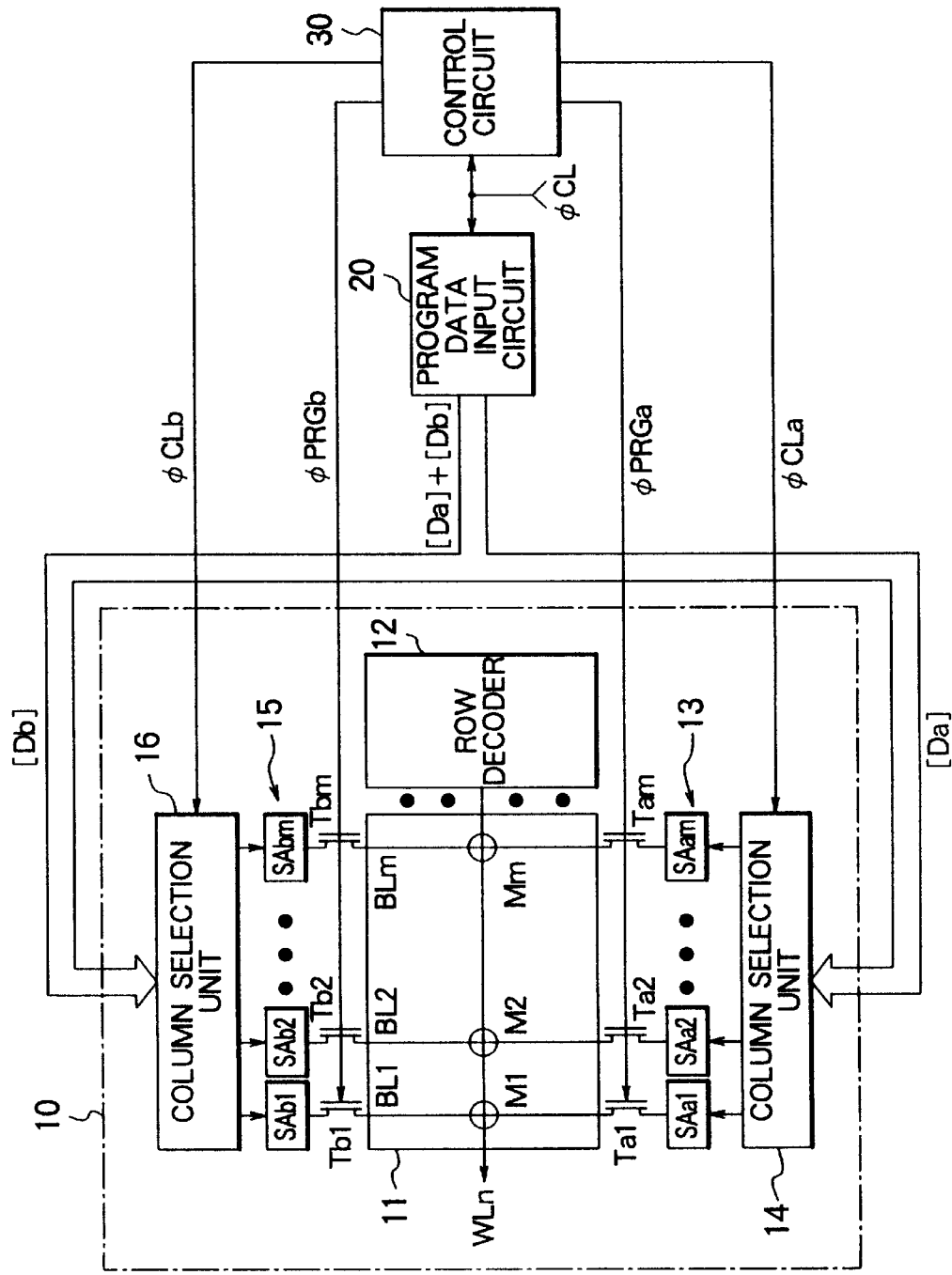
FIG. 3 is a view of the configuration of a first embodiment of a semiconductor nonvolatile memory device according to/the present invention.
Figure 4:
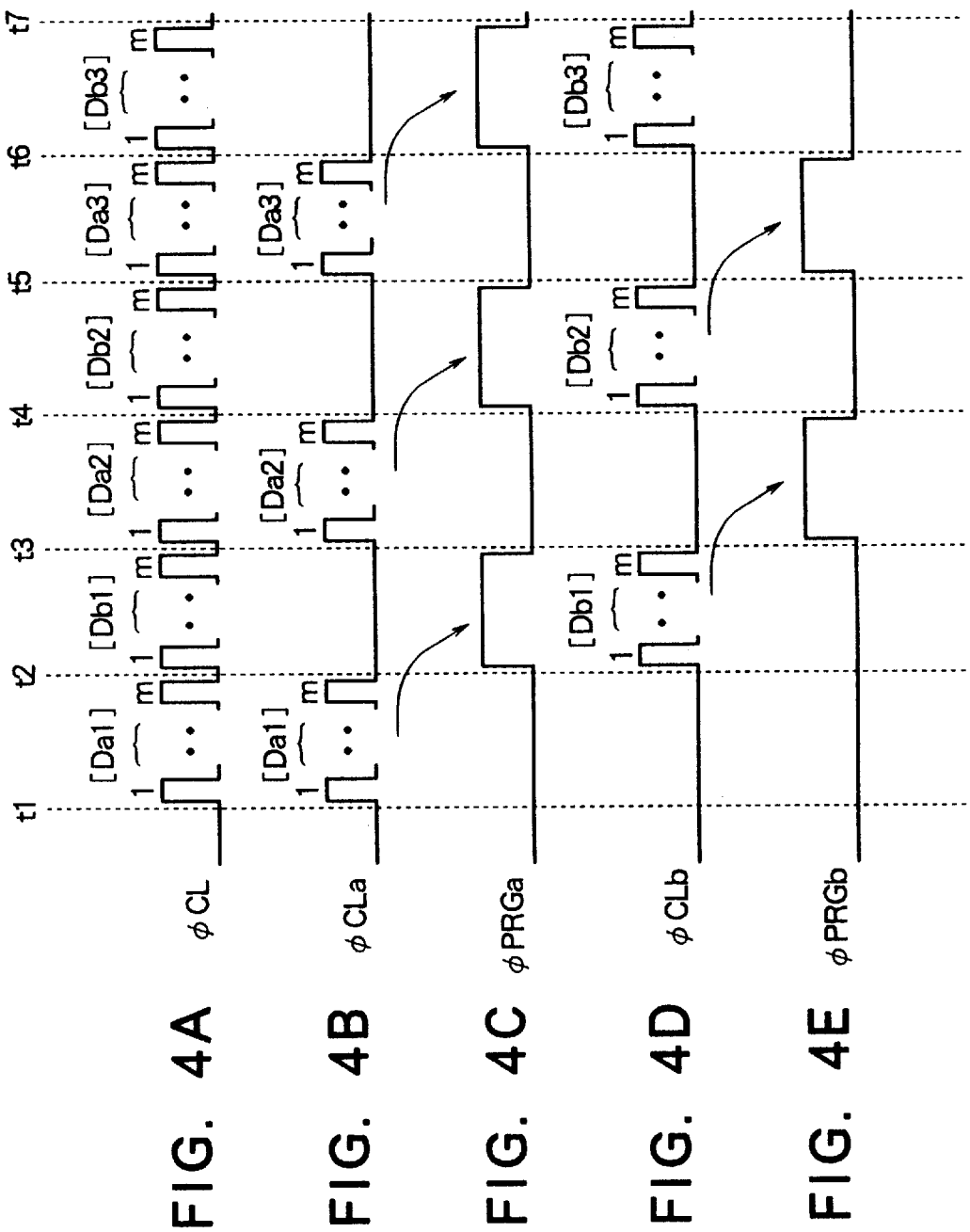
FIGS. 4A–4E are views of the timing chart of the data programming operation in the semiconductor nonvolatile memory device of FIG. 3.

FIG. 3 is a view of the configuration of a first embodiment of a semiconductor nonvolatile memory device according to the present invention.

In FIG. 3, 10 denotes a memory array. The memory array 10 is constituted by a memory array body portion 11, a row decoder 12, a first data latch circuit group 13 constituted by first data latch circuits SAa1 to SAam provided for every bit line, a first column selection unit 14 for performing input and output of the data to and from the first data latch circuit group 13, a second data latch circuit group 15 constituted by second data latch circuits SAb1 to SAbm provided for every bit line, and a second column selection unit 16 for performing input and output of the data to and from the second data latch circuit group 15.

Further, in the memory array body portion 11, m number of (about 512 bytes to 2048 bytes in the present embodiment) bit lines BL1 to BLm are arranged.

FIG. 3 illustrates a case where page programming is carried out with respect to the memory transistors M1 to Mm by selecting the word line WLn.

The bit lines BL1 to BLm are connected to the first data latch circuits SAa1 to SAam via the transfer gates Ta1 to Tam on one end of the memory array and connected to the second data latch circuits SAb1 to SAbm via the transfer gates Tb1 to Tbm on the other end of the memory array.

Note that, the transfer gates Ta1 to Tam and Tb1 to Tbm are constituted by for example n-channel metal oxide semiconductor (NMOS) transistors.

Reference numeral 20 denotes a program data input circuit. The program data input circuit 20 alternately and continuously inputs the first page program data [Da] and the second page program data [Db] to a data bus inside the chip from an external data bus in synchronization with the basic data transfer clock signal ΦCL.

Reference numeral 30 denotes a control circuit. The control circuit 30 receives the basic data transfer clock signal ΦCL and generates the following first data transfer clock signal ΦCLa, second data transfer clock signal ΦCLb, first data program signal ΦPRGa, and second data program signal ΦPRGb.

Namely, the first data transfer clock signal ΦCLa is supplied to the first column selection unit 14, and the page program data [Da] is shifted to the first data latch circuits SAa1 to SAam by the operation of the first column selection unit 14 in synchronization with this first data transfer clock signal ΦCLa.

The second data transfer clock signal ΦCLb is supplied to the second column selection unit 16, and the page program data [Db] is shifted to the second data latch circuits SAb1 to SAbm by the operation of the second column selection unit 16 in synchronization with the second data transfer clock signal ΦCLb.

The first data program signal ΦPRGa is supplied to the gate electrodes of the transfer gates Ta1 to Tam, and the page program data latched in the data latch circuits SAa1 to SAam is programmed with respect to the memory transistors M1 to Mm connected to the selected word line under the control of the first data program signal ΦPRGa.

Further, the second data program signal ΦPRGb is supplied to the gate electrodes of the transfer gates Tb1 to Tbm, and the page program data latched in the data latch circuits SAb1 to SAbm is programmed with respect to the memory transistors M1 to Mm connected to the selected word line under the control of the second data program signal ΦPRGb.

FIGS. 4A–4E are views of the timing chart of the data programming operation in the semiconductor nonvolatile memory device of FIG. 3.

Below, an explanation will be made of the timing chart of FIGS. 4A–4E while referring to the configuration of FIG. 3.

First, the data programming operation is started with respect to the semiconductor nonvolatile memory device of FIG. 3 at the time t1. After this, the basic data transfer clock signal ΦCL is continuously output.

In the step from the times t1 to t2, the 1a-th page program data [Da1] is shifted to the data latch circuits SAa1 to SAam in synchronization with the first data transfer clock signal ΦCLa.

Next, in the step from the time t2 to t3, the 1b-th page program data [Db1] is shifted to the data latch circuits SAb1 to SAbm in synchronization with the second data transfer clock signal ΦCLb. Simultaneously, the programming of the 1a-th page program data [Da1] is carried out together for the memory transistors connected to the selected word line in synchronization with the first data program signal ΦPRGa.

Next, in the step from the time t3 to t4, the 2a-th page program data [Da2] is shifted to the data latch circuits SAa1 to SAam in synchronization with the first data transfer clock signal ΦCLa. Simultaneously, the programming of the 1b-th page program data [Db1] is carried out together for the memory transistors connected to the selected word line in synchronization with the second data program signal ΦPRGb.

Similarly, in the step from the times t4 to t5, the 2b-th page program data [Db2] is shifted and, simultaneously, the programming of the 2a-th page program data [Da2] is carried out.

Similarly, from the times t5 to t6, the 3a-th page program data [Da3] is shifted and, simultaneously. the programming of the 2b-th page program data [Db2] is carried out.

Similarly, in the step from the times t6 to t7, the 3b-th page program data [Db3] is shifted and, simultaneously, the programming of the 3a-th page program data [Da3] is carried out.

The above timing operations are repeatedly carried out until all page programming is ended.

As explained above, according to the semiconductor nonvolatile memory device of the first embodiment, first data latch circuits SAa1 to SAam and second data latch circuits SAb1 to SAbm forming pairs with each other are provided for every bit line and then each repeatedly performs the data transfer step and the data programming step in parallel to each other.

Accordingly, data programming at a speed two times the usual speed is possible.

Further, even in a case where the page programming is continuously carried out over a plurality of page areas, it is not necessary to divide the data into every page program data for transfer. Accordingly, the data programming operation is possible without the control of an external controller.

Second Embodiment

Figure 5:
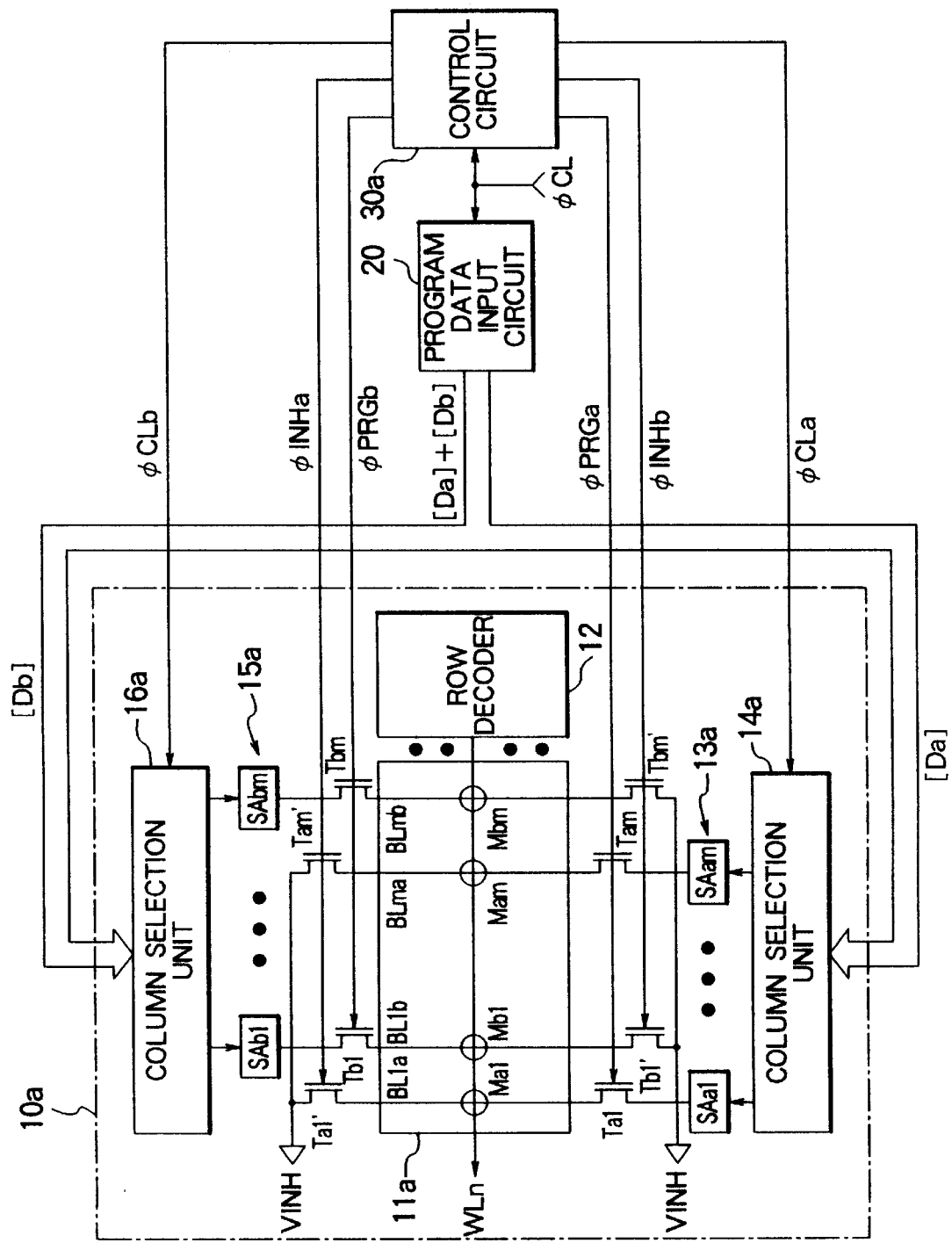
FIG. 5 is a view of the configuration of a second embodiment of a semiconductor nonvolatile memory device according to the present invention.
Figure 6:
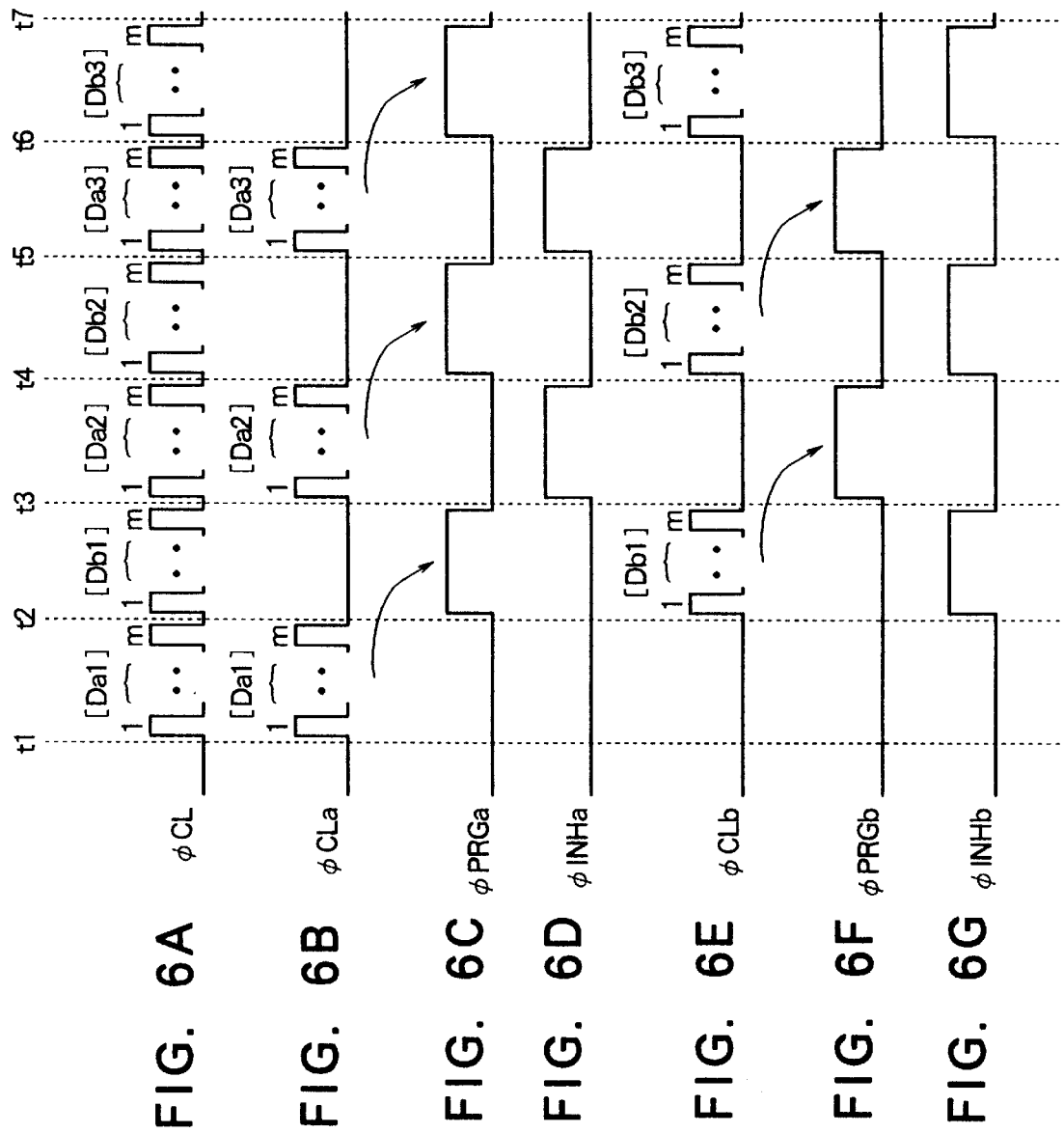
FIGS. 6A–6G are views of the timing chart of the data programming operation in the semiconductor nonvolatile memory device of FIG. 5.

FIG. 5 is a view of a second embodiment of the semiconductor nonvolatile memory device according to the present invention.

The difference of the example of the configuration according to the second embodiment of FIG. 5 from the example of the configuration according to the first embodiment of FIG. 3 resides in the fact that the bit lines are alternately divided into first bit lines and second bit lines. They are respectively connected to the first data latch circuits SAa1 to SAam and the second data latch circuits SAb1 to SAbm forming pairs with each other.

By adopting such a configuration, the number of the data latch circuits necessary for every bit line can be kept at one as in the usual case and there is no restriction in the pattern layout.

In FIG. 5, 10a denotes the memory array. This is constituted by a memory array body portion 11a, row decoder 12, a first data latch circuit group 13a in which first data latch circuits SAa1 to SAam are provided for every first bit lines BL1a to BLma, a first column selection unit 14a performing the input and output of the data with the first data latch circuit group 13a, a second data latch circuit group 15a in which second data latch circuits SAb1 to SAbm are provided for every second bit lines BL1b to BLmb, and a second column selection unit 16a performing the input and output of the data with the second data latch circuit group 15a.

Further, in the memory array body, m number of (about 512 bytes to 2048 bytes in the case of the present embodiment) first bit lines BL1a to BLma and second bit lines BL1b to BLmb are alternately arranged. FIG. 5 illustrates a case where the page programming is carried out with respect to the memory transistors Ma1 to Mam or Mb1 to Mbm by selecting the word line WLn.

The first bit lines BL1a to BLma are connected to the first data latch circuits SAa1 to SAam via the transfer gates Ta1 to Tam on one end of the memory array and connected to the supply line of the program inhibition voltage VINH via the transfer gates Ta1' to Tam' on the other end of the memory array.

Similarly, the second bit lines BL1b to BLmb are connected to the second data latch circuits SAb1 to SAbm via the transfer gates Tb1 to Tbm on one end of the memory array and connected to the supply line of the program inhibition voltage VINH via the transfer gates Tb1' to Tbm' on the other end of the memory array.

Note that, the transfer gates Ta1 to Tam, Ta1' to Tam', Tb1 to Tbm, and Tb1' to Tbm' are constituted by for example NMOS transistors.

Reference numeral 20 denotes a program data input circuit. The program data input circuit 20 alternately and continuously inputs the first page program data [Da] and second page program data [Db] to the data bus inside the chip from the external data bus in synchronization with the basic data transfer clock signal ΦCL.

Further, 30a denotes a control circuit. The control circuit 30a generates the following six types of signals, that is, a first data transfer clock signal ΦCLa, second data transfer clock signal ΦCLb, first data program signal ΦPRGa, second data program signal ΦPRGb, first program inhibition signal ΦINHa, and second program inhibition signal ΦINHb in response to the basic data transfer clock signal ΦCL.

The first data transfer clock signal ΦCLa is supplied to the column selection unit 14a, and the page program data [Da] is shifted to the first data latch circuits SAa1 to SAam by the operation of the column selection unit 14a in synchronization with the first data transfer clock signal ΦCLa.

The second data transfer clock signal ΦCLb is supplied to the column selection unit 16a, and the page program data [Db] is shifted to the second data latch circuits SAb1 to SAbm by the operation of the column selection unit 16a in synchronization with the second data transfer clock signal ΦCLb.

Further, the first data program signal ΦPRGa is supplied to the gate electrodes of the transfer gates Ta1 to Tam, and the page program data latched in the data latch circuits SAa1 to SAam is programmed with respect to the memory transistors Ma1 to Mam connected to the selected word line under the control of the first data program signal ΦPRGa.

The second data program signal ΦPRGb is supplied to the gate electrodes of the transfer gates Tb1 to Tbm, and the page program data latched in the data latch circuits SAb1 to SAbm is programmed with respect to the memory transistors Mb1 to Mbm connected to the selected word line under the control of the second data program signal ΦPRGb.

Further, the first program inhibition signals ΦINHa are supplied to the gate electrodes of the transfer gates Ta1' to Tam'. The program inhibition voltages VINH are supplied to the first bit lines BL1a to BLma under the control of the first program inhibition signals ΦINHa.

Further, the second program inhibition signals ΦINHb are supplied to the gate electrodes of the transfer gates Tb1' to Tbm'. The program inhibition voltages VINH are supplied to the second bit lines BL1b to BLmb under the control of the second program inhibition signals ΦINHb.

FIGS. 6A–6G are views of the timing chart of the data programming operation in the semiconductor nonvolatile memory device of FIG. 5.

Below, an explanation will be made of the timing chart of FIGS. 6A–6G while referring to the configuration etc. of FIG. 5.

First, the data programming operation is started with respect to the semiconductor nonvolatile memory device of FIG. 5 at the time t1. After this, the basic data transfer clock signal ΦCL is continuously output.

In the step from the times t1 to t2, the 1a-th page program data [Da1] is shifted to the data latch circuits SAa1 to SAam in synchronization with the first data transfer clock signal ΦCLa.

Next, in the step from the times t2 to t3, the 1b-th page program data [Db1] is shifted to the data latch circuits SAb1 to SAbm in synchronization with the second data transfer clock signal ΦCLb. Simultaneously, the programming of the 1a-th page program data [Da1] is carried out for the memory transistors Ma1 to Mam in synchronization with the first data program signal ΦPRGa.

In this case, the second program inhibition signal ΦINHb is set at the high level. For this reason, the program inhibition voltages VINH are supplied to the bit lines BL1b to BLmb, and the programming to the memory transistors Mb1 to Mbm is inhibited.

Next, in the step from the times t3 to t4, the 2a-th page program data [Da2] is shifted to the data latch circuits SAa1 to SAam in synchronization with the first data transfer clock signal ΦCLa. Simultaneously, the programming of the 1b-th page program data [Db1] is carried out for the memory transistors Mb1 to Mbm in synchronization with the second data program signal ΦPRGb.

In this case, the first program inhibition signal ΦINHa is set at the high level. For this reason, the program inhibition voltages VINH are supplied to the bit lines BL1a to BLma, and the programming to the memory transistors Ma1 to Mam is inhibited.

Similarly, in the step from the times t4 to t5, the 2b-th page program data [Db2] is shifted and, simultaneously, the programming of the 2a-th page program data [Da2] is carried out.

Similarly, in the step from the times t5 to t6, the 3a-th page program data [Da3] is shifted and, simultaneously, the programming of the 2b-th page program data [Db2] is carried out.

Similarly, in the step from the times t6 to t7, the 3b-th page program data [Db3] is shifted and, simultaneously, the programming of the 3a-th page program data [Da3] is carried out.

The above timing operations are repeatedly carried out until all page programming is ended.

As explained above, according to the semiconductor nonvolatile memory device according to the present second embodiment, the bit lines are alternately divided into first bit lines and second bit lines. They are respectively connected to the first data latch circuits and second data latch circuits forming pairs with each other, and then each repeatedly performs the data transfer step and the data programming step in parallel to each other.

Accordingly, data programming at a speed two times the usual speed is possible.

Further, the number of the data latch circuits necessary for every bit line can be similar to the usual case, and there is no restriction on pattern layout.

Further, even in a case where the page programming is continuously carried out over a plurality of page areas, it is not necessary to divided the data into every page program data for transfer. Accordingly, the data programming operation is possible without the control of an external controller.

Third Embodiment

Figure 7:
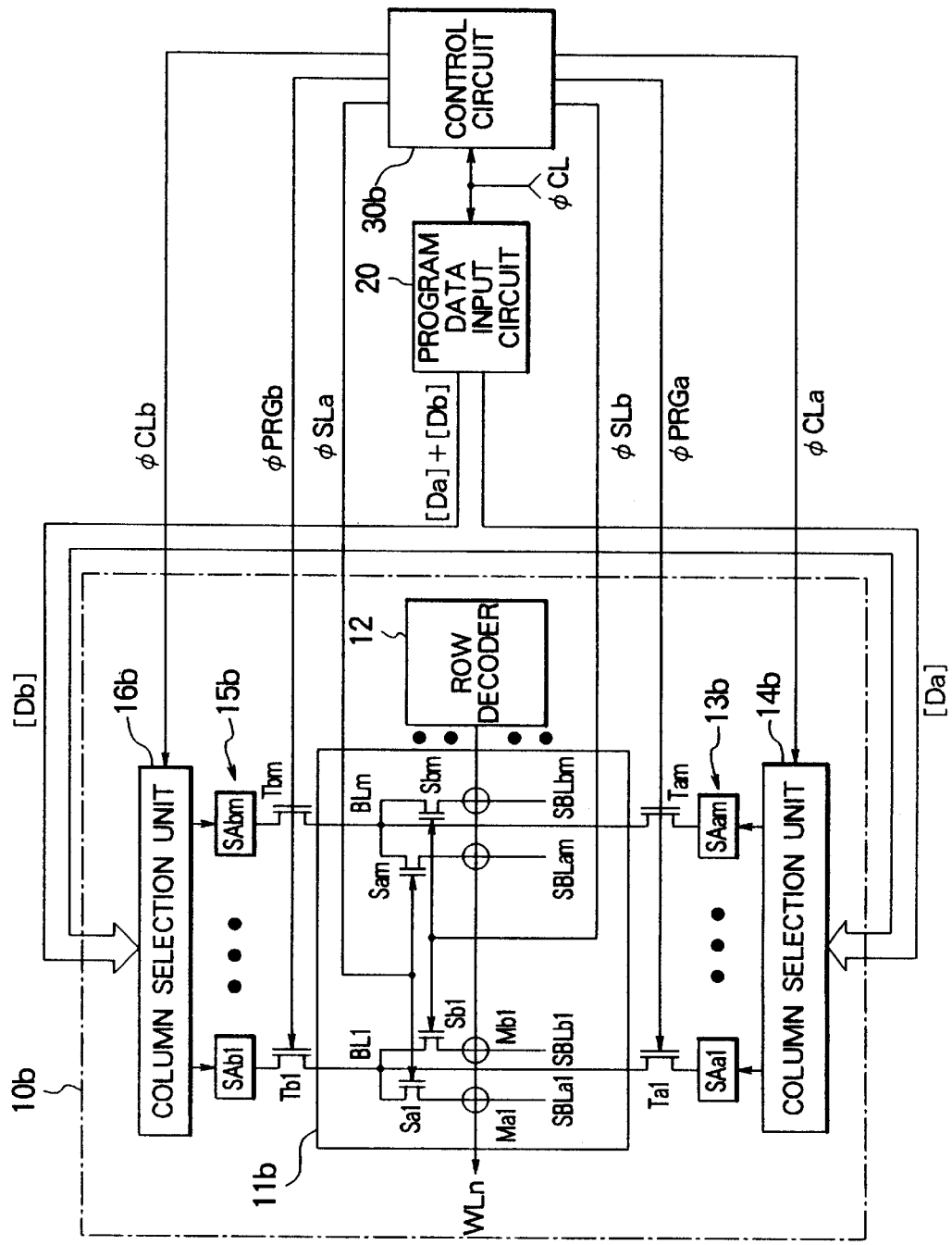
FIG. 7 is a view of the configuration of a third embodiment of the semiconductor nonvolatile memory device according to the present invention.
Figure 8:
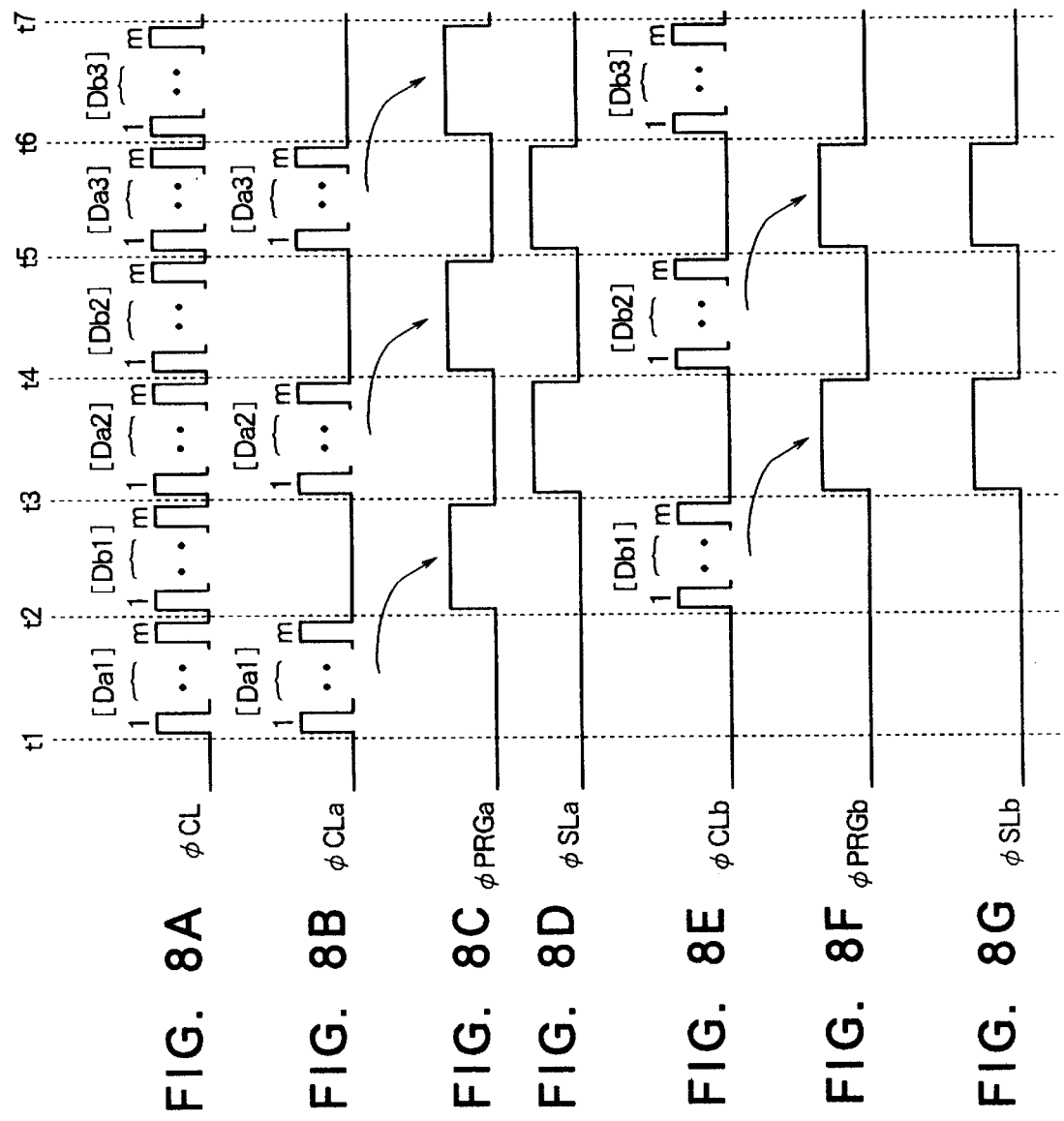
FIGS. 8A–8G are views of the timing chart of the data programming operation in the semiconductor nonvolatile memory device of FIG. 7.

FIG. 7 is a view of the configuration of a third embodiment of the semiconductor nonvolatile memory device according to the present invention.

The difference of the example of the configuration according to the third embodiment of FIG. 7 from the example of the configuration according to the first embodiment of FIG. 3 is as follows.

Namely, in the case of the present third embodiment, bit lines are classified into first sub-bit lines and second sub-bit lines forming pairs with each other, and then they are respectively connected to the first data latch circuits and second data latch circuits forming pairs with each other.

Note that, the classification is carried out by using for example NAND strings as a unit.

In this case, bit lines are classified into first NAND strings and second NAND strings forming pairs with each other, and then connected to the first data latch circuits and second data latch circuits forming pairs with each other.

Accordingly, the number of bit lines may be kept to substantially half, therefore even if there are two data latch circuits per bit line, the pattern layout of the data latch circuit is similar to that of the usual case, and there is no restriction.

In FIG. 7, 10b denotes a memory array. The memory array 10b is constituted by a memory array body portion 11b, row decoder 12, a first data latch circuit group 13b in which first data latch circuits SAa1 to SAam are provided for every first sub-bit lines (first NAND strings) SBLa1 to SBLam, a first column selection unit 14b performing the input and output of the data with the first data latch circuit group 13b, a second data latch circuit group 15b in which second data latch circuits SAb1 to SAbm are provided for every second sub-bit lines (second NAND strings) SBLb1 to SBLbm, and a second column selection unit 16b performing the input and output of the data with the second data latch circuit group 15b.

Further, in the memory array body, m number of (about 512 bytes to 2048 bytes in the case of the present embodiment) bit lines BL1 to BLm are arranged in the form of columns. FIG. 7 illustrates a case where the page programming is carried out with respect to the memory transistors Ma1 to Mam or Mb1 to Mbm by selecting the word line WLn.

The bit lines BL1 to BLm are connected to the first sub-bit lines (first NAND strings) SBLa1 to SBLam via the selection gates Sa1 to Sam and connected to the second sub-bit lines (second NAND strings) SBLb1 to SBLbm via the selection gates Sb1 to Sbm.

Further, the bit lines BL1 to BLm are connected to the first data latch circuits SAa1 to SAam via the transfer gates Ta1 to Tam on one end of the memory array and connected to the second data latch circuits SAb1 to SAbm via the transfer gates Tb1 to Tbm on the other end of the memory array.

Note that, the transfer gates Ta1 to Tam and Tb1 to Tbm and the selection gates Sa1 to Sam and Sb1 to Sbm are constituted by NMOS transistors.

Reference numeral 20 denotes the program data input circuit. The program data input circuit 20 alternately and continuously inputs the first page program data [Da] and second page program data [Db] to a data bus inside the chip from an external data bus in synchronization with the basic data transfer clock signal ΦCL.

Reference numeral 30b denotes a control circuit. The control circuit 30b generates the following six types of signals, that is, a first data transfer clock signal ΦCLa, second data transfer clock signal ΦCLb, first data program signal ΦPRGa, second data program signal ΦPRGb, first selection signal ΦSLa, and second selection signal ΦSLb in response to the basic data transfer clock signal ΦCL.

The first data transfer clock signal ΦCLa is supplied to the column selection unit 14b, and the page program data [Da] is shifted to the first data latch circuits SAa1 to SAam by the operation of the column selection unit 14b in synchronization with the first data transfer clock signal ΦCLa.

The second data transfer clock signal ΦCLb is supplied to the column selection unit 16b, and the page program data [Db] is shifted to the second data latch circuits SAb1 to SAbm by the operation of the column selection unit 16b in synchronization with the second data transfer clock signal ΦCLb.

The first data program signal ΦPRGa is supplied to the gate electrodes of the transfer gates Ta1 to Tam, and the page program data latched in the data latch circuits SAa1 to SAam is programmed with respect to the memory transistors Ma1 to Mam connected to the selected word line under the control of the first data program signal ΦPRGa.

The second data program signal ΦPRGb is supplied to the gate electrodes of the transfer gates Tb1 to Tbm, and the page program data latched in the data latch circuits SAb1 to SAbm is programmed with respect to the memory transistors Mb1 to Mbm connected to the selected word line under the control of the second data program signal ΦPRGb.

The first selection signals ΦSLa are supplied to the gate electrodes of the selection gates Sa1 to Sam. The first sub-bit lines (first NAND strings) SBLa1 to SBLam are selected by the control of the first selection signal ΦSLa and connected to the bit lines BL1 to BLm.

The second selection signals ΦSLb are supplied to the gate electrodes of the selection gates Sb1 to Sbm. The second sub-bit lines (second NAND strings) SBLb1 to SBLbm are selected by the control of the second selection signal ΦSLb and connected to the bit lines BL1 to BLm.

FIGS. 8A–8G are views of the timing chart of the data programming operation in the semiconductor nonvolatile memory device of FIG. 7.

Below, an explanation will be made of the timing chart of FIGS. 8A–8G while referring to the configuration etc. of FIG. 7.

First, the data programming operation is started with respect to the semiconductor nonvolatile memory device of FIG. 7 at the time t1. After this, the basic data transfer clock signal ΦCL is continuously output.

In the step from the times t1 to t2, the 1a-th page program data [Da1] is shifted to the data latch circuits SAa1 to SAam in synchronization with the first data transfer clock signal ΦCLa.

Next, in the step from the times t2 to t3, the 1b-th page program data [Db1] is shifted to the data latch circuits SAb1 to SAbm in synchronization with the second data transfer clock signal ΦCLb. Simultaneously, the programming of the 1a-th page program data [Da1] is carried out for the memory transistors Ma1 to Mam in synchronization with the first data program signal ΦPRGa.

In this case, the second selection signal ΦSLb is set at the low level. For this reason, the second sub-bit lines (second NAND strings) SBLb1 to SBLbm become the floating state, and the programming to the memory transistors Mb1 to Mbm is inhibited.

Next, in the step from the times t3 to t4, the 2a-th page program data [Da2] is shifted to the data latch circuits SAa1 to SAam in synchronization with the first data transfer clock signal ΦCLa. Simultaneously, the programming of the 1b-th page program data [Db1] is carried out for the memory transistors Mb1 to Mbm in synchronization with the second data program signal ΦPRGb.

In this case, the first selection signal ΦSLa is set at the low level. For this reason, the first sub-bit lines (first NAND strings) SBLa1 to SBLam become the floating state, and the programming to the memory transistors Ma1 to Mam is inhibited.

Similarly, in the step from the times t4 to t5, the 2b-th page program data [Db2] is shifted and, simultaneously, the programming of the 2a-th page program data [Da2] is carried out.

Similarly, in the step from the times t5 to t6, the 3a-th page program data [Da3] are shifted and, simultaneously, the programming of the 2b-th page program data [Db2] is carried out.

Similarly, in the step from the times t6 to t7, the 3b-th page program data [Db3] are shifted and, simultaneously, the programming of the 3a-th page program data [Da3] is carried out.

The above timing operations are repeatedly carried out until all page programming is ended.

As explained above, according to the semiconductor nonvolatile memory device according to the present third embodiment, the bit lines are classified into first sub-bit lines (first NAND strings) and second sub-bit lines (second NAND strings) forming pairs with each other for every bit line, and then respectively connected to the first data latch circuits and second data latch circuits forming pairs with each other, and each repeatedly performs the data transfer step and the data programming step in parallel to each other.

Accordingly, data programming at a speed two times the usual speed is possible.

Further, the number of bit lines can be kept at substantially a half, therefore even if there are two data latch circuits per bit line, the pattern layout of the data latch circuits is similar to that of the usual case, and there is no restriction.

Further, even in a case where the page programming is continuously carried out over a plurality of page areas, it is not necessary to divide the data into every page program data for transfer. Accordingly, the data programming operation is possible without the control of an external controller.

Fourth Embodiment

Figure 9:
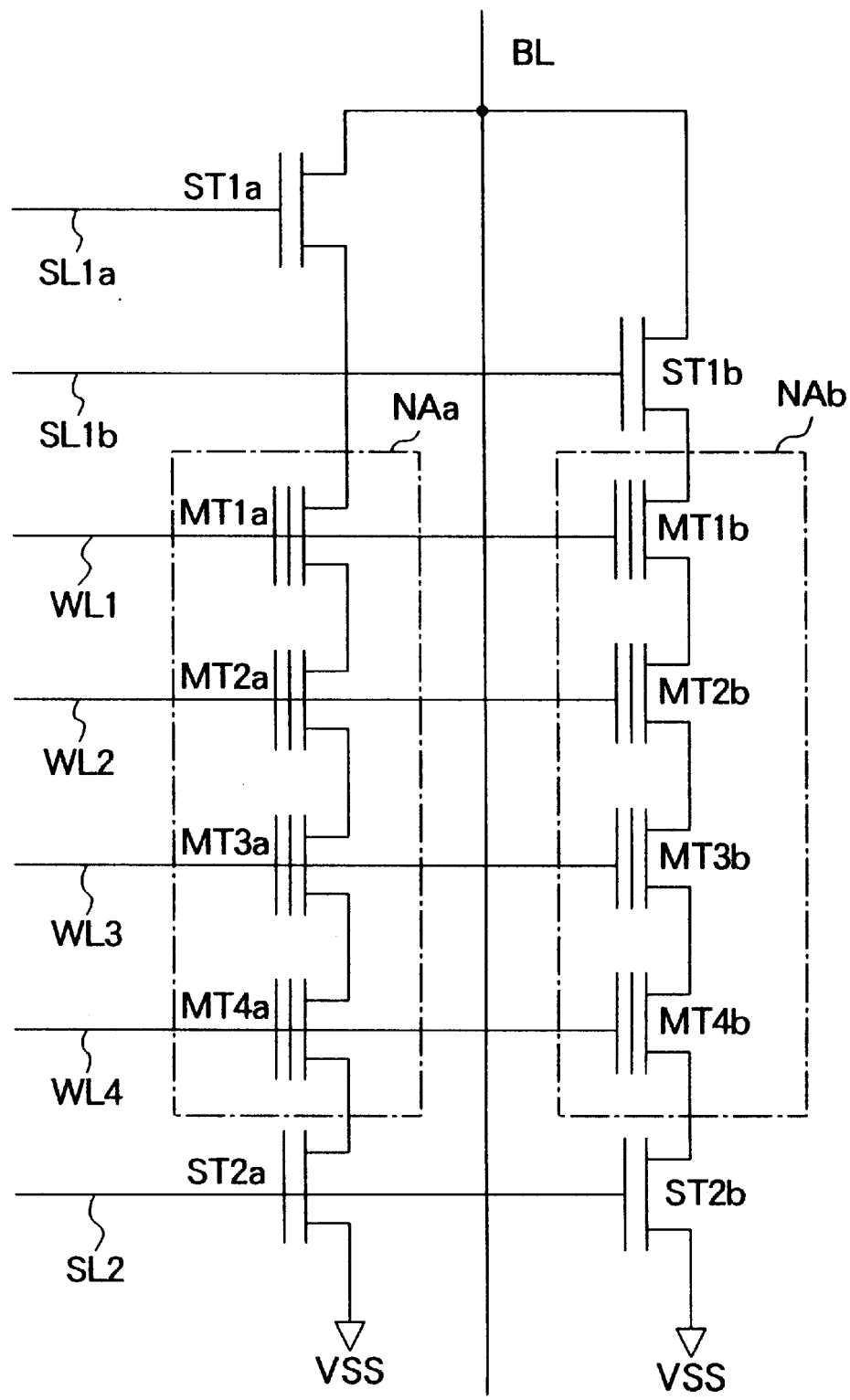
FIG. 9 is a view for explaining a fourth embodiment of the semiconductor nonvolatile memory device according to the present invention and shows the memory array of a NAND type semiconductor nonvolatile memory device.

FIG. 9 is a view for explaining a fourth embodiment of the semiconductor nonvolatile memory device according to the present invention and shows the memory array of an NAND type semiconductor nonvolatile memory device.

The NAND type semiconductor nonvolatile memory device of FIG. 9 constitutes a memory array in which bit lines are classified into first NAND strings and second NAND strings forming pairs with each other.

Accordingly, the number of the bit lines can be kept at substantially half, therefore the pattern layout of the bit lines and data latch circuits becomes easy.

Further, in the case of the NAND type semiconductor nonvolatile memory device already explained by referring to FIG. 7, the number of the bit lines becomes substantially a half, therefore even if there are two data latch circuits per bit line, the pattern layout is similar to that of the usual case.

The NAND type semiconductor nonvolatile memory device of FIG. 9 is for convenience shown as a memory array where four memory transistors are connected in series to one NAND string, but in an actual memory array, generally the number of the memory transistors connected in series to one NAND string is about 16.

In FIG. 9, two NAND strings NAa and NAb forming a pair with each other are classified and connected to a bit line BL.

The first NAND string NAa is constituted by memory transistors MT1a to MT4a connected in series, connected to the bit line BL via the selection transistor ST1a, and connected to the ground line VSS via the selection transistor ST2a.

The second NAND string NAb is constituted by memory transistors MT1b to MT4b connected in series, connected to the bit line BL via the selection transistor ST1b, and connected to the ground line VSS via the selection transistor ST2b.

The selection transistor ST1a is controlled by the selection line SL1a, the selection transistor ST1b is controlled by the selection line SL1b, the selection transistors ST2a and ST2b are controlled by the selection line SL2, and the memory transistors MT1a to MT4a and MT1b to MT4b are controlled by the word lines WL1 to WL4.

Figure 10:
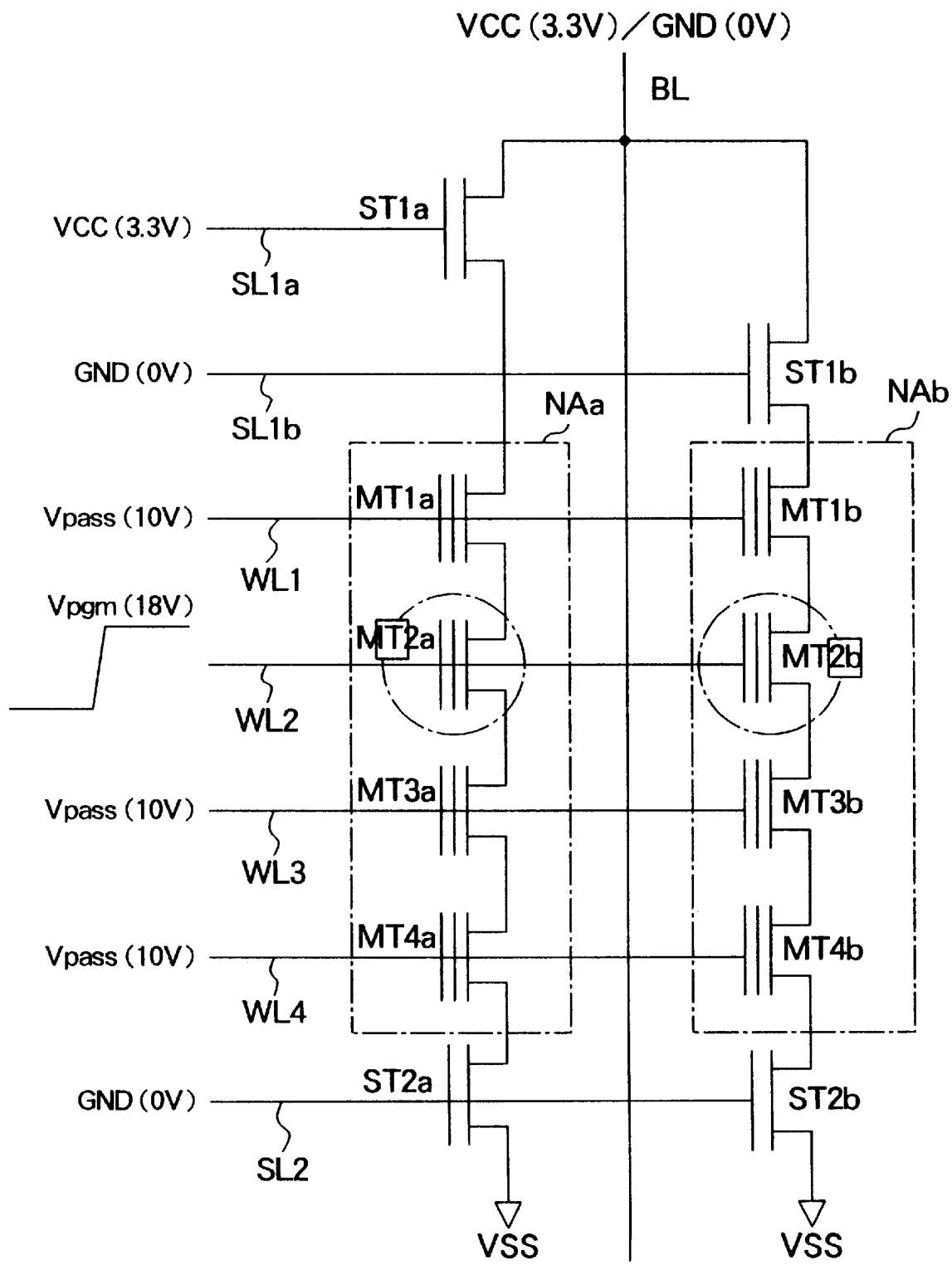
FIG. 10 is a view of an operation where the data programming is carried out by a self boost operation in the NAND type semiconductor nonvolatile memory device of FIG. 9.

FIG. 10 is a view of the operation where the data programming is carried out by a self-boost operation in the NAND type semiconductor nonvolatile memory device of FIG. 9.

The explanation will be made of the operation in the NAND type semiconductor nonvolatile memory device of FIG. 10 where the word line WL2 is selected and the page programming is carried out, the NAND string NAa is selected, and the MT2a is the selection memory transistor, and the NAND string NAb is not selected and the MT2b is the nonselected memory transistor.

First, a power source voltage VCC (3.3V) is applied to the selection line SL1a, and a ground voltage GND (0V) is applied to the selection lines SL1b and SL2. By this, the NAND string NAa in which the selected memory transistor MT2a exists is electrically connected to the bit line BL, and the NAND string NAb in which the nonselected memory transistor MT2b exists becomes the floating state.

Next, a program voltage Vpgm (for example 18V) is applied to the selected word line WL2, and a pass voltage Vpass (for example 10V) is applied to the nonselected word lines WL1 and WL3 to WL4.

As a result, the channel portion of the NAND string NAa in which the selected memory transistor MT2a exists becomes as follows according to the content of the data (voltage applied to BL).

Namely, where the MT2a is the memory transistor for which the programming should be inhibited, the bit line BL is set at the power source voltage VCC (3.3V), the channel portion of the NAND string NAa becomes the floating state, the potential of the channel portion is boosted mainly by the capacitor coupling with the pass voltage Vpass applied to the nonselected word lines (number is three in FIG. 10, but generally 15) and rises up to the program inhibition voltage, and the data programming to the memory transistor MT2a is inhibited.

Contrary to this, where MT2a is a memory transistor which should be programmed, the bit line BL is set at the ground voltage GND (0V). Also, the channel portion potential of the NAND string NAa is discharged to the ground voltage GND level, the data programming to the memory transistor MT2a is carried out by the potential difference with the program voltage Vpgm applied to the selected word line WL2, and the threshold voltage is shifted to the positive direction and for example becomes from −3V of the erasing state to about 2V.

On the other hand, the channel portion of the NAND string NAb in which the nonselected memory transistor MT2b exists becomes the floating state regardless of the voltage applied to the bit line BL, the potential of the channel portion is boosted by the capacitor coupling with the pass voltage Vpass applied to the nonselected word lines and rises up to the program inhibition voltage, and the data programming to the memory transistor MT2b is inhibited.

As explained above, according to the semiconductor nonvolatile memory device according to the present fourth embodiment, the bit lines are classified into the first NAND strings and second NAND strings forming pairs with each other. This makes it possible to selectively perform the page programming by the self boost operation with respect to either of the first NAND strings or second NAND strings. Accordingly, even in a memory array in which the number of the bit lines and the number of the data latch circuits are halved, the page programming by the self boost operation is possible and this is preferred in the pattern layout.

Further, even in the case of a NAND type semiconductor nonvolatile memory device already explained by referring to FIG. 5, it is possible to selectively perform the page programming by the self boost operation with respect to either of the NAND strings.

Fifth Embodiment

Figure 11:
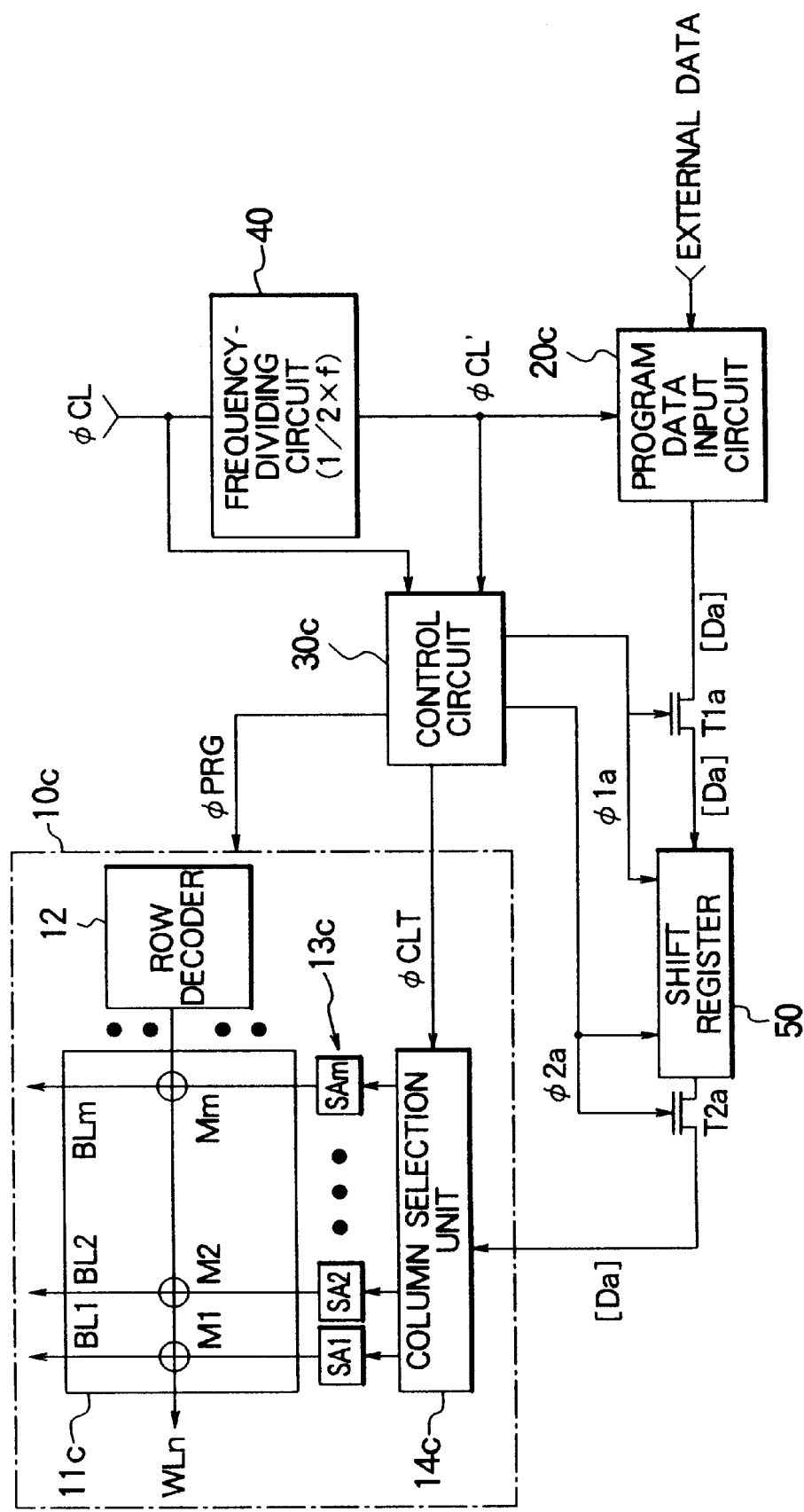
FIG. 11 is a view of the configuration of a fifth embodiment of the semiconductor nonvolatile memory device according to the present invention.
Figure 12:
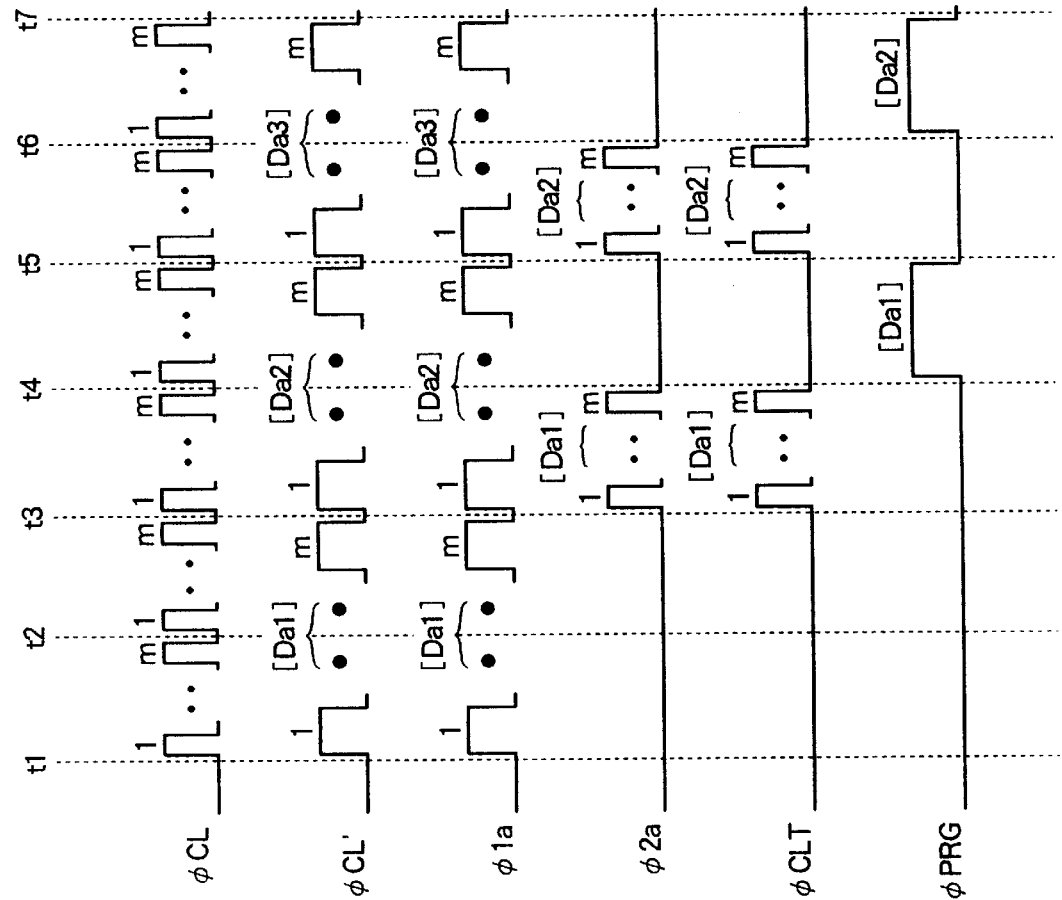
FIGS. 12A–12F are views of the timing chart of the data programming operation in the semiconductor nonvolatile memory device of FIG. 11.

FIG. 11 is a view of the configuration of a fifth embodiment of the semiconductor nonvolatile memory device according to the present invention.

In FIG. 11, 10c denotes a memory array. The memory array 10c is constituted by a memory array body portion 11c, a row decoder 12, a data latch circuit group 13c in which the data latch circuits SA1 to SAm are provided for every bit line, and the column selection unit 14c.

Further, in the memory array, m number of (about 512 bytes to 2048 bytes in the present embodiment) bit lines BL1 to BLm are arranged. FIG. 11 illustrates a case where the word line WLn is selected, and the page programming is carried out with respect to the memory transistors M1 to Mm.

Reference numeral 20c denotes a program data input circuit. The program data input circuit 20c continuously inputs the page program data [Da] to a data bus inside the chip from an external data bus in synchronization with the data transfer clock signal ΦCL' obtained by dividing the frequency of the basic clock signal ΦCL to one-half by a frequency dividing circuit 40 and performs the shift to a shift register 50.

Further, 30c denotes a control circuit. The control circuit 30c generates the following four types of signals, that is, the data transfer control signals Φ1a, Φ2a, and ΦCLT and the data program signal ΦPRG upon receipt of the data transfer clock signal ΦCL' obtained by dividing the frequency of the basic clock signal ΦCL to one-half by the frequency dividing circuit 40.

The data transfer control signal Φ1a is supplied to the gate electrode of the transfer gate T1a and shift register 50, and the page program data [Da] is shifted to the shift register 50 in synchronization with the data transfer control signal Φ1a.

The data transfer control signal Φ2a is supplied to the gate electrode of the transfer gate T2a and shift register 50, and the page program data [Da] is shifted from the shift register 50 to the data latch circuits SA1 to SAm in synchronization with the data transfer control signal Φ2a.

The data transfer control signal ΦCLT is supplied to the column selection unit 14c, and, under the control of the data transfer control signal ΦCLT, the page program data [Da] stored in the shift register 50 is shifted to the data latch circuits SA1 to SAm.

Further, under the control of the data program signal ΦPRG, the page program data latched in the data latch circuits SA1 to SAm is programmed with respect to the memory transistors M1 to Mm connected to the selected word line.

In this way, the transfer gates T1a and T2a are provided for controlling the shift of the page program data [Da] from the program data input circuit 20c to the shift register 50 or from the shift register 50 to the data latch circuits SA1 to SAm and are constituted by for example NMOS transistors.

FIGS. 12A–12F are views of the timing chart of the data programming operation in the semiconductor nonvolatile memory device of FIG. 11.

Below, an explanation will be made of the timing chart of FIGS. 12A–12F by referring to the configuration etc. of FIG. 11.

First, at the time t1, the data programming operation is started with respect to the semiconductor nonvolatile memory device of FIG. 11. After this, the basic clock signal ΦCL and the data transfer clock signal ΦCL' obtained by dividing the frequency of the basic clock signal ΦCL to one half are continuously output.

Further, in synchronization with the data transfer clock signal ΦCL', the page program data [Da] is continuously input to a data bus inside the chip from an external data bus.

Namely, from the times t1 to t3, the 1a-th page program data [Da1] is continuously input, from the times t3 to t5, the 2a-th page program data [Da2] is continuously input, and from the times t5 to t7, the 3a-th page program data [Da3] is continuously input.

First, in the step from the times t1 to t3, the 1a-th page program data [Da1] is shifted to the shift register 50 in synchronization with the data transfer control signal Φ1a.

Next, in the step from the times t3 to t4, the 1a-th page program data [Da1] stored in the shift register 50 is shifted to the data latch circuits SA1 to SAm in synchronization with the data transfer control signals Φ2a and ΦCLT.

Simultaneously, in the step from the times t3 to t5, the 2a-th page program data [Da2] is shifted to the shift register 50 in synchronization with the data transfer control signal Φ1a and sequentially stored.

Further, in the step from the times t4 to t5, the programming of the 1a-th page program data [Da1] is carried out together for the memory transistors connected to the selected word line in synchronization with the data program signal ΦPRG.

Next, in the step from the times t5 to t6, the 2a-th page program data [Da2] stored in the shift register 50 is shifted to the data latch circuits SA1 to SAm in synchronization with the data transfer control signals Φ2a and ΦCLT.

Simultaneously, in the step from the times t5 to t7, the 3a-th page program data [Da3] is shifted to the shift register 50 in synchronization with the data transfer control signal Φ1a and sequentially stored.

Further, in the step from the times t6 to t7, the programming of the 2a-th page program data [Da2] is carried out together for memory transistors connected to the selected word line in synchronization with the data program signal ΦPRG.

The above timing operations are repeatedly carried out until all page programming is ended.

As explained above, according to the semiconductor nonvolatile memory device according to the present fifth embodiment, the shift register is provided outside of the memory array, the page program data is continuously input to the shift register, and the page programming is repeatedly carried out with respect to the memory array from the shift register. Accordingly, even in a case where the page programming is continuously carried out over a plurality of page areas, it is not necessary to divide this for every page program data for transfer.

Accordingly, the data programming operation is possible without the control of an external controller.

Sixth Embodiment

Figure 13:
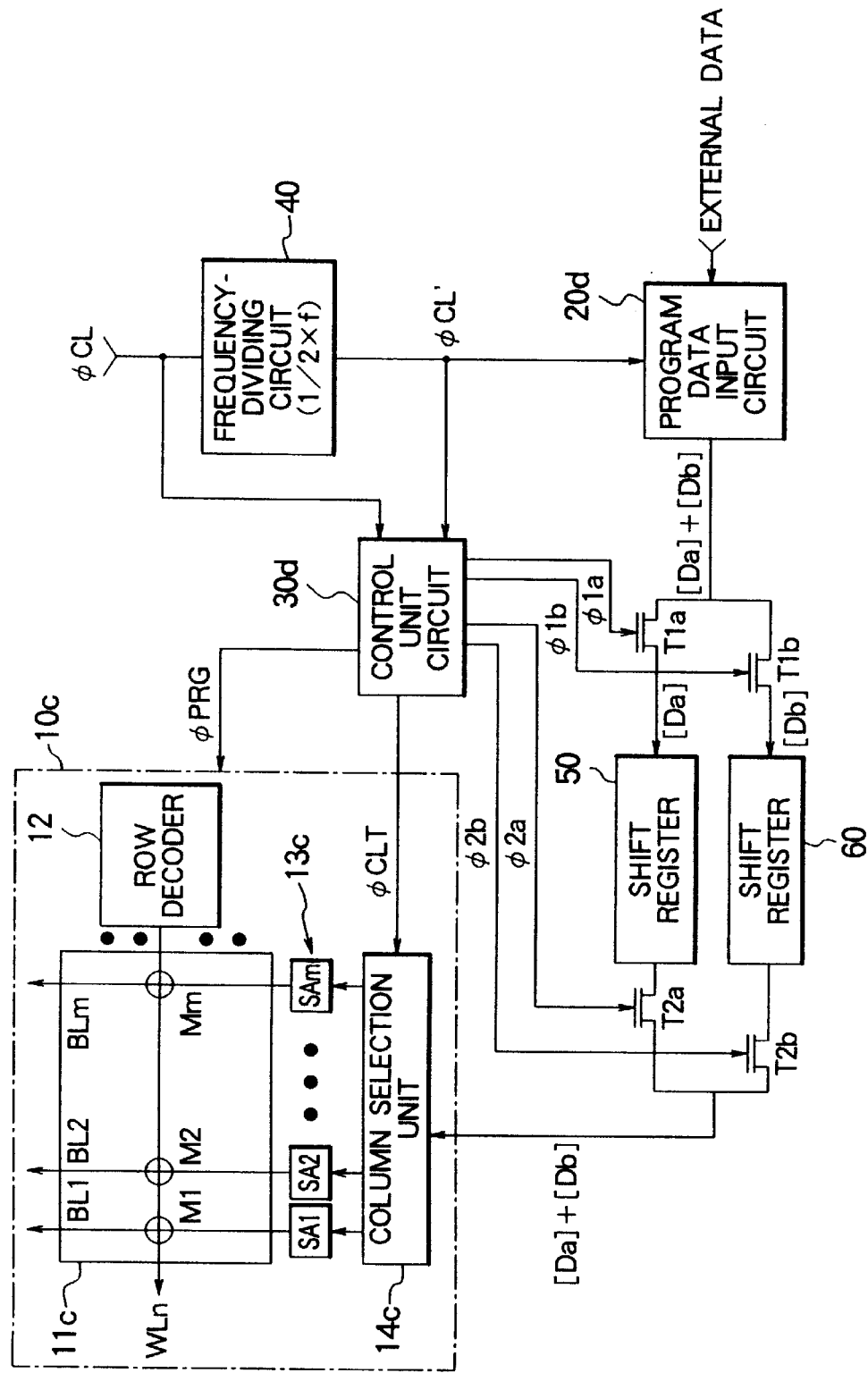
FIG. 13 is a view of the configuration of a sixth embodiment of the semiconductor nonvolatile memory device according to the present invention.
Figure 14:
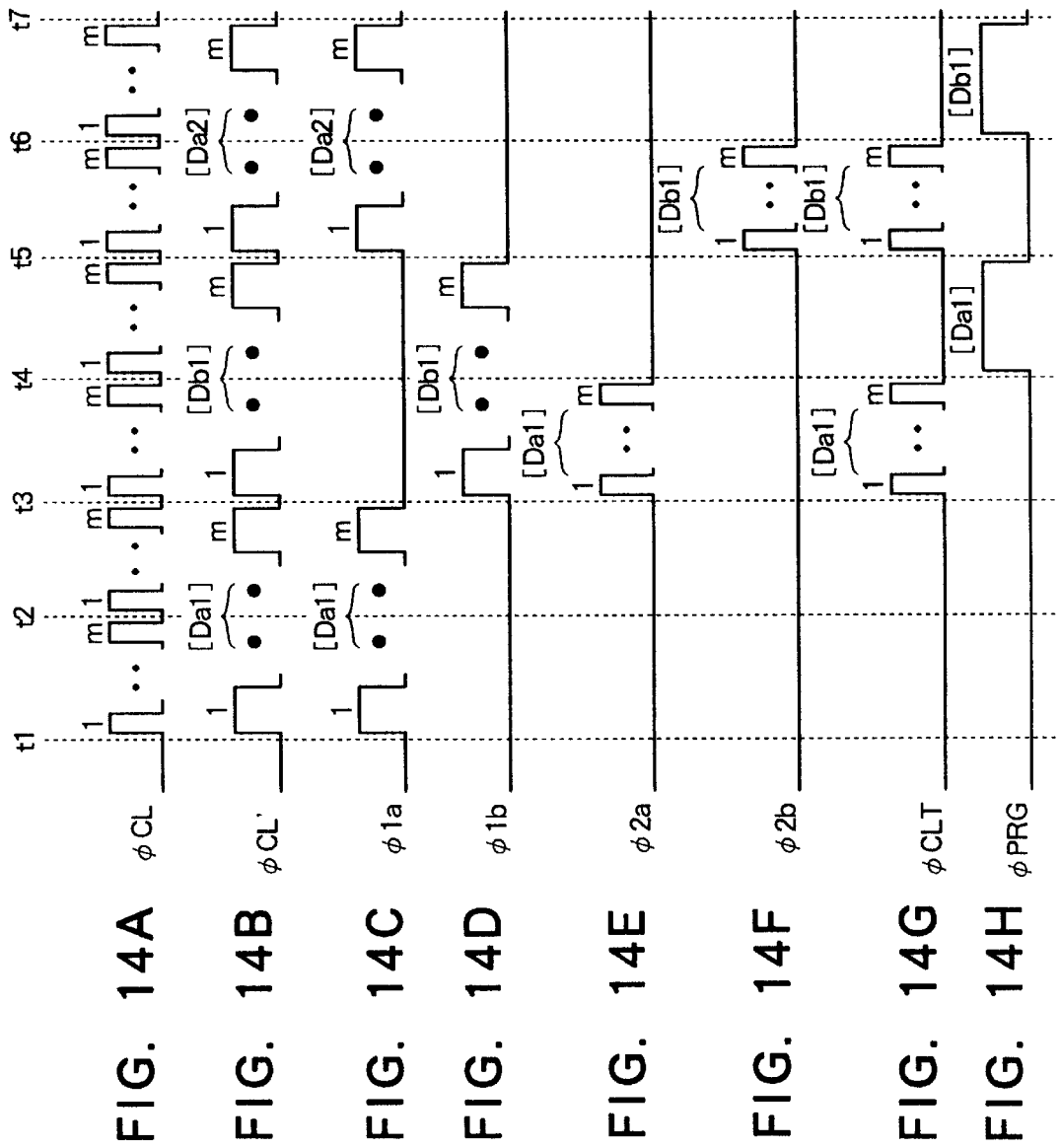
FIGS. 14A–14H are views of the timing chart of the data programming operation in the semiconductor nonvolatile memory device of FIG. 13.

FIG. 13 is a view of the configuration of a sixth embodiment of the semiconductor nonvolatile memory device according to the present invention.

In FIG. 13, 10c denotes a memory array. The memory array 10c is constituted by a memory array body portion 11c, row decoder 12, a data latch circuit group 13c in which the data latch circuits SA1 to SAm are provided for every bit line, and the column selection unit 14c.

Further, in the memory array, m number of (about 512 bytes to 2048 bytes in the present embodiment) bit lines BL1 to BLm are arranged. FIG. 13 illustrates a case where the word line WLn is selected, and the page programming is carried out with respect to the memory transistors M1 to Mm.

Reference numeral 20d denotes the program data input circuit. The program data input circuit 20d alternately and continuously inputs the first page program data [Da] and the second page program data [Db] to an data bus inside the chip from an external data bus in synchronization with the data transfer clock signal ΦCL' obtained by dividing the frequency of the basic clock signal ΦCL to one half by the frequency dividing circuit 40 and shifts them to a first shift register 50 and a second shift register 60, respectively.

Further, 30d denotes a control circuit. The control circuit 30d generates the following six types of signals, that is, the data transfer control signals Φ1a, Φ1b, Φ2a, Φ2b, and ΦCLT and the data program signal ΦPRG upon receipt of the data transfer clock signal ΦCL' obtained by dividing the frequency of the basic clock signal ΦCL to one half by the frequency dividing circuit 40.

The data transfer control signal Φ1a is supplied to the gate electrode of the transfer gate T1a, and the page program data [Da] is shifted to the shift register 50 in synchronization with the data transfer control signal Φ1a.

The data transfer control signal Φ1b is supplied to the gate electrode of the transfer gate T1b, and the page program data [Db] is shifted to the shift register 60 in synchronization with the data transfer control signal Φ1b.

The data transfer control signal Φ2a is supplied to the gate electrode of the transfer gate T2a, and the page program data [Da] is shifted from the shift register 50 to the data latch circuits SA1 to SAm in synchronization with the data transfer control signal Φ2a.

The data transfer control signal Φ2b is supplied to the gate electrode of the transfer gate T2b, and the page program data [Da] is shifted from the shift register 60 to the data latch circuits SA1 to SAm in synchronization with the data transfer control signal Φ2b.

The data transfer control signal ΦCLT is supplied to the column selection unit 14c, and under the control of the data transfer control signal ΦCLT, the page program data [Da] or [Db] stored in the shift register 50 or shift register 60 is shifted to the data latch circuits SA1 to SAm.

Further, under the control of the data program signal ΦPRG, the page program data latched in the data latch circuits SA1 to SAm is programmed with respect to the memory transistors M1 to Mm connected to the selected word line.

In this way, the transfer gates T1a, T1b, T2a, and T2b are provided for controlling the shift transfer of the page program data [Da] and [Db] from the program data input circuit 20d to the shift register 50 and shift register 60 or from the shift register 50 and shift register 60 to the data latch circuits SA1 to SAm.

FIGS. 14A–14H are views of the timing chart of the data programming operation in the semiconductor nonvolatile memory device of FIG. 13.

Below, an explanation will be made of the timing chart of FIGS. 14A–14H by referring to the configuration etc. of FIG. 13.

First, at the time t1, the data programming operation is started with respect to the semiconductor nonvolatile memory device of FIG. 13. After this, the basic clock signal ΦCL and the data transfer clock signal ΦCL' obtained by dividing the frequency of the basic clock signal ΦCL to one half are continuously output.

Further, in synchronization with the data transfer clock signal ΦCL', the page program data [Da] and [Db] are alternately and continuously input to the data bus inside the chip from the external data bus.

Namely, from the times t1 to t3, the 1a-th page program data [Da1] is continuously input, from the times t3 to t5, the 1b-th page program data [Db1] is continuously input, and from the times t5 to t7, the 2a-th page program data [Da2] is continuously input.

First, in the step from the times t1 to t3, the 1a-th page program data [Da1] is shifted to the shift register 50 in synchronization with the data transfer control signal Φ1a.

Next, in the step from the times t3 to t5, the 1b-th page program data [Db1] is shifted to the shift register 60 in synchronization with the data transfer control signal Φ1b and sequentially stored.

Further, simultaneously, in the step from the times t3 to t4, the 1a-th page program data [Da1] stored in the shift register 50 is shifted to the data latch circuits SA1 to SAm in synchronization with the data transfer control signals Φ2a and ΦCLT.

Further, in the step from the times t4 to t5, the programming of the 1a-th page program data [Da1] is carried out together for memory transistors connected to the selected word line in synchronization with the data program signal ΦPRG.

Next, in the step from the times t5 to t7, the 2a-th page program data [Da2] is shifted to the shift register 50 in synchronization with the data transfer control signal Φ1a.

Further, in the step from the times t5 to t6, the 1b-th page program data [Db1] stored in the shift register 60 is shifted to the data latch circuits SA1 to SAm in synchronization with the data transfer control signals Φ2b and ΦCLT.

Further, in the step from the times t6 to t7, the programming of the 1b-th page program data [Db1] is carried out together for memory transistors connected to the selected word line in synchronization with the data program signal ΦPRG.

The above timing operations are repeatedly carried out until all page programming is ended.

As explained above, according to the semiconductor nonvolatile memory device according to the present sixth embodiment, the first shift register and the second shift register are provided outside of the memory array, the page program data of a plurality of page areas are alternately divided and continuously input to the shift registers, and the page programming is repeatedly carried out with respect to the memory array from the shift registers. Accordingly, even in a case where the page programming is continuously carried out over a plurality of page areas, it is not necessary to divide this into every page program data for transfer.

Accordingly, the data programming operation is possible without the control of the external controller.

Seventh Embodiment

Figure 15:
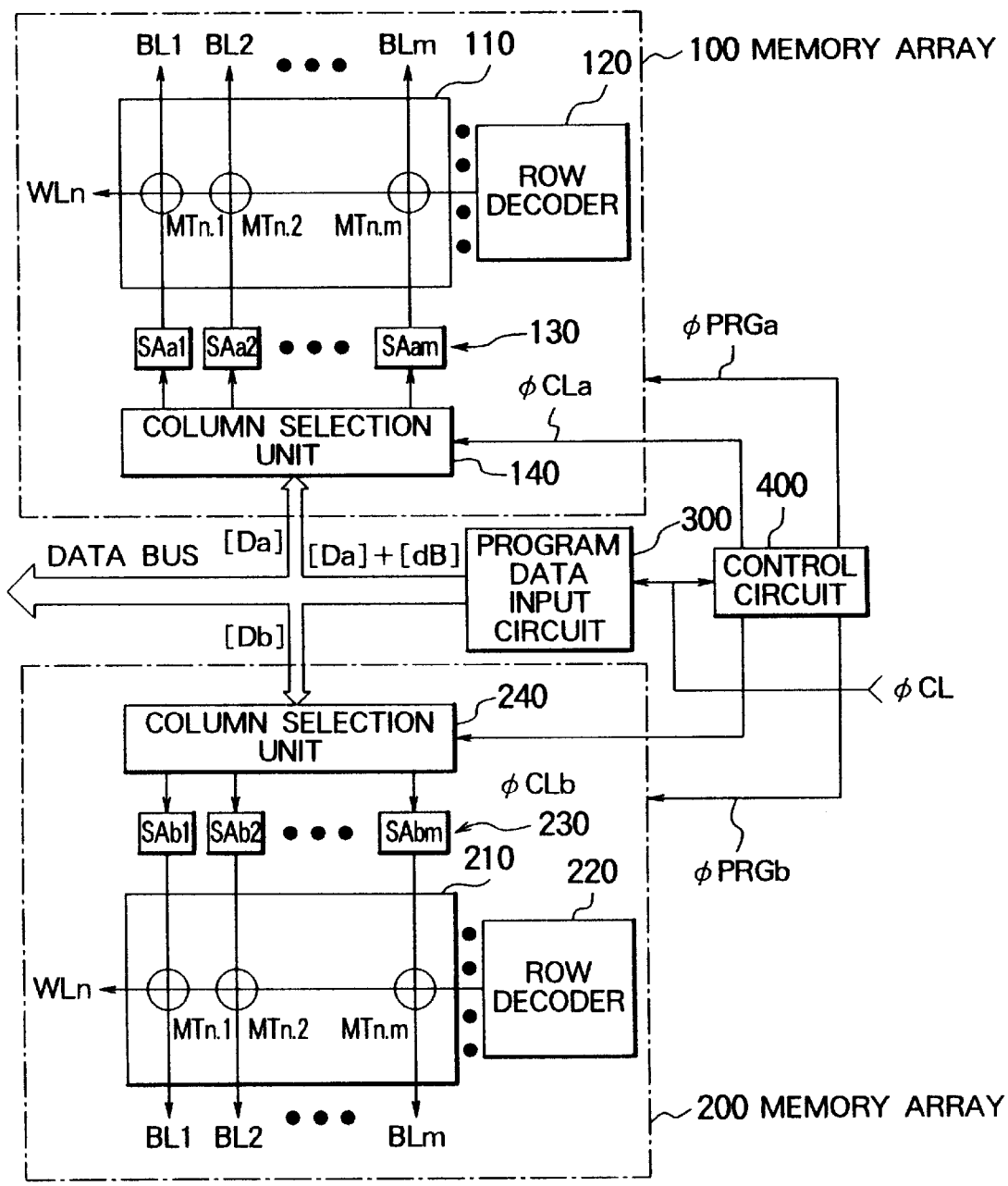
FIG. 15 is a view of the configuration of a seventh embodiment of the semiconductor nonvolatile memory device according to the present invention.

FIG. 15 is a view of the configuration of a seventh embodiment of the semiconductor nonvolatile memory device according to the present invention.

In FIG. 15, 100 denotes a first memory array. The first memory array 100 is constituted by a memory array body portion 110, a row decoder 120, a data latch circuit group 130 constituted of data latch circuits SAa1 to SAam provided for every bit line, and a column selection unit 140.

Further, in the memory array body portion 110, m number of (about 1024 bytes to 2048 bytes in the present embodiment) bit lines B1 to Bm are arranged. FIG. 15 illustrates a case where the word line WLn is selected, and the page programming is carried out with respect to the memory transistors MTn,1 to MTn,m.

Similarly, 200 denotes a second memory array. The second memory array 200 is constituted by a memory array body portion 210, a row decoder 220, a data latch circuit group 230 constituted by data latch circuits SAb1 to SAbm provided for every bit line, and a column selection unit 240.

Further, similarly, in the memory array body portion 210, m number of (about 1024 bytes to 2048 bytes in the present embodiment) bit lines B1 to Bm are arranged. FIG. 15 illustrates a case where the word line WLn is selected, and the page programming is carried out with respect to the memory transistors MTn,1 to MTn,m.

Reference numeral 300 denotes a program data input circuit. The program data input circuit 300 alternately and continuously transfers the page program data [Da] which should be programmed in the first memory array 100 and the page program data [Db] which should be programmed in the second memory array 200 from an external data bus to a data bus inside the chip in synchronization with the basic data transfer clock signal ΦCL.

Reference numeral 400 denotes a control circuit. The control circuit 400 generates four types of signals, that is, the first data transfer clock signal ΦCLa, the second data transfer clock signal ΦCLb, first data program signal ΦPRGa, and second data program signal ΦPRGb upon receipt of the basic data transfer clock signal ΦCL.

The first data transfer clock signal ΦCLa is supplied to the column selection unit 140, and the page program data [Da] is shifted to the data latch circuits SAa1 to SAam in the first memory array 100 by the operation of the column selection unit 140 in synchronization with this first data transfer clock signal ΦCLa.

Further, the second data transfer clock signal ΦCLb is supplied to the column selection unit 240, and the page program data [Db] is shifted to the data latch circuits SAb1 to SAbm in the second memory array 200 by the operation of the column selection unit 240 in synchronization with this second data transfer clock signal ΦCLb.

Further, the first data program signal ΦPRGa is supplied to the first memory array 100, and the page program data latched in the data latch circuits SAa1 to SAam is programmed with respect to the memory transistors MTn,1 to MTn,m in the first memory array 100 under the control of the first data program signal ΦPRGa.

Further, the second data program signal ΦPRGb is supplied to the second memory array 200, and the page program data latched in the data latch circuits SAb1 to SAbm is programmed with respect to the memory transistors MTn,1 to MTn,m in the second memory array 200 under the control of the second data program signal ΦPRGb.

Figure 16:
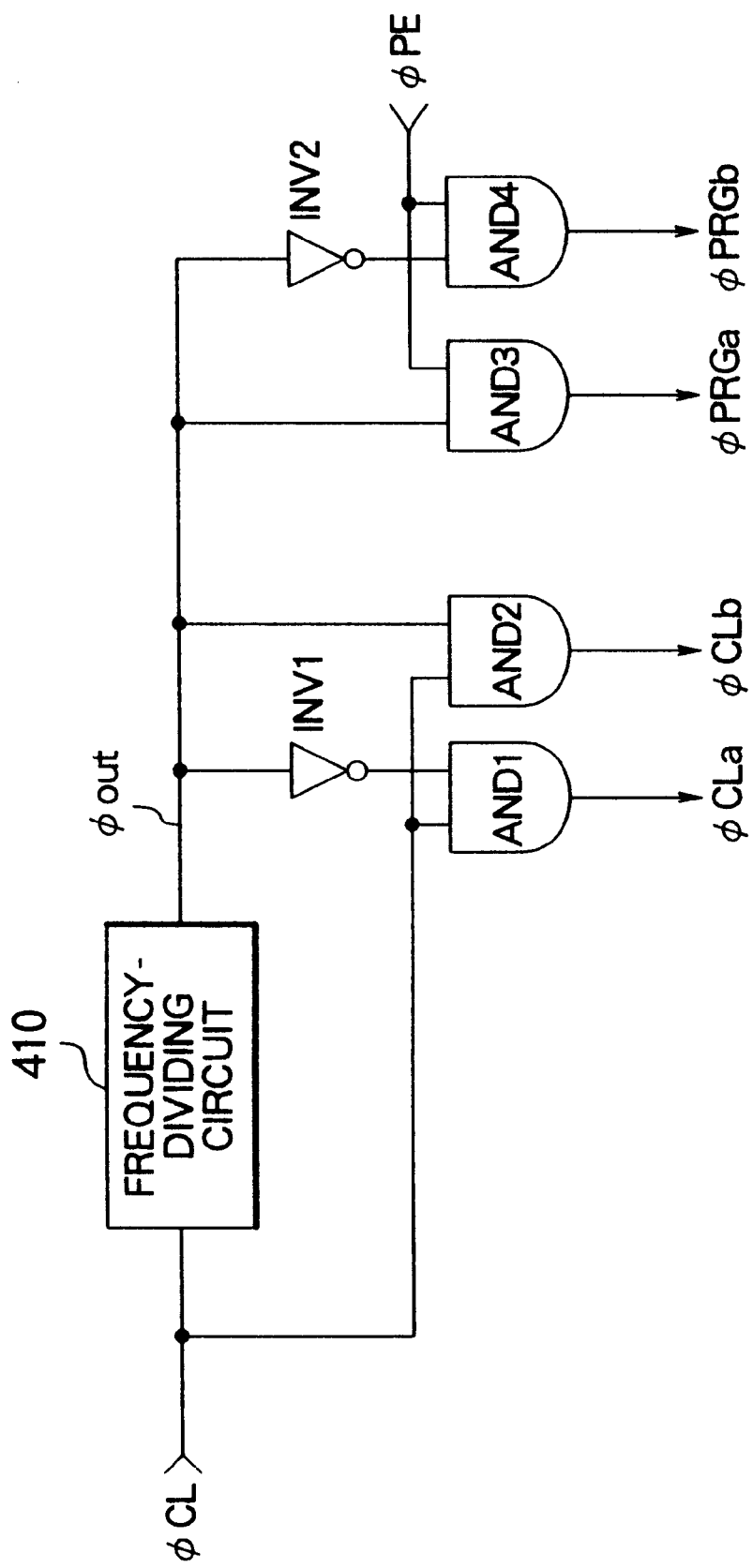
FIG. 16 is a view of the concrete circuit configuration of a control circuit in the semiconductor nonvolatile memory device of FIG. 15.

FIG. 16 is a view showing the concrete circuit configuration of the control circuit 400 in the semiconductor nonvolatile memory device of FIG. 15.

As shown in FIG. 16, the control circuit 400 is constituted by a frequency dividing circuit 410, inverters INV1 and INV2, and AND gates AND1 to AND4.

The frequency dividing circuit 410 outputs the signal Φout obtained by dividing the frequency of the basic data transfer clock signal ΦCL to 1/512.

As shown in FIG. 16, the first data transfer clock signal ΦCLa is generated by taking the logical AND between the inverted output of the frequency-divided signal Φout by the inverter INV1 and the basic data transfer clock signal ΦCL at the AND gate AND1.

Further, the second data transfer clock signal ΦCLb is generated by taking the logical AND between the frequency-divided signal Φout and the basic data transfer clock signal ΦCL at the AND gate AND2.

Further, the first data program signal ΦPRGa is generated by taking the logical AND between the frequency-divided signal Φout and a program enable signal ΦPE illustrated in FIGS. 17B, C, E at the AND gate AND3.

Further, the second data program signal ΦPRGb is generated by taking the logical AND between the inverted output of the frequency-divided signal Φout of the inverter INV2 and the program enable signal ΦPE illustrated in FIGS. 17B, C, G at the AND gate AND4.

Further, FIGS. 17A–17G are views showing the timing chart of the data programming operation in the semiconductor nonvolatile memory device of FIG. 15.

Below, an explanation will be made of the timing chart of FIGS. 17A–17G while referring to FIG. 15 and FIG. 16.

First, at the time t1, the data programming operation is started with respect to the semiconductor nonvolatile memory device of FIG. 15. After this, the basic data transfer clock signal ΦCL is continuously output.

In the step from the times t1 to t2, in synchronization with the first data transfer clock signal ΦCLa, the 1a-th page program data [Da1] is shifted to the data latch circuits SAa1 to SAam in the first memory array 100.

Next, in the step from the times t2 to t3, in synchronization with the second data transfer clock signal ΦCLb, the 1b-th page program data [Db1] is shifted to the data latch circuits SAb1 to SAbm in the second memory array 200, and, simultaneously, the programming of the 1a-th page program data [Da1] is carried out with respect to the first memory array 100 in synchronization with the first data program signal ΦPRGa.

Next, in the step from the times t3 to t4, the 2a-th page program data [Da2] is shifted to the data latch circuits SAa1 to SAam in the first memory array 100 in synchronization with the first data transfer clock signal ΦCLa, and simultaneously, the programming of the 1b-th page program data [Db1] is carried out with respect to the second memory array 200 in synchronization with the second data program signal ΦPRGb.

Similarly, in the step from the times t4 to t5, the 2b-th page program data [Db2] is shifted, and, simultaneously, the programming of the 2a-th page program data [Da2] is carried out.

Similarly, in the step from the times t5 to t6, the 3a-th page program data [Da3] is shifted, and, simultaneously, the programming of the 2b-th page program data [Db2] is carried out.

Similarly, in the step from the times t6 to t7, the 3b-th page program data [Db3] is shifted, and, simultaneously, the programming of the 3a-th page program data [Da3] is carried out.

The above timing operations are repeatedly carried out until all page programming is ended.

As explained above, according to the semiconductor nonvolatile memory device according to the present seventh embodiment, there are two memory arrays forming a pair with each other in which page programming is carried out in units of word lines, and the data transfer operation and the data programming operation are carried out alternately and in parallel to each other with respect to the two memory arrays, therefore data programming at a speed two times the usual speed becomes possible.

Further, according to the semiconductor nonvolatile memory device of the seventh embodiment, the data transfer of the page program data is simultaneously carried out with respect to the above two memory arrays in synchronization with a constant clock pulse, therefore even in a case where the page programming is continuously carried out over a plurality of page areas, it is not necessary to divide the data into every page program data for transfer, accordingly the data programming operation is possible without the control of the external controller.

Note that, in the seventh embodiment, the explanation was mainly made of a case where two memory arrays forming a pair exist in one semiconductor chip, but needless to say the present invention can be applied to also a case where two memory arrays forming a pair exist in separate semiconductor chips. While the invention has been described with reference to specific embodiments chosen for purposes of illustration, it should be apparent that numerous modifications could be made thereto by those skilled in the art without departing from the basic concept and scope of the invention.

What is claimed is:

1. A semiconductor nonvolatile memory device, comprising:

a plurality of memory transistors in which data is electrically programmed in units of pages by performing the data programming together for all memory transistors of a sector selected in response to page program data in units of sectors are arranged in the form matrix; and a means for continuously inputting the page program data of a plurality of page areas in synchronization with a constant clock pulse and continuously performing the page programming according to the plurality of page program data.

2. A semiconductor nonvolatile memory device as set forth in claim 1, wherein the sector unit is a word line unit.

3. A semiconductor nonvolatile memory device as set forth in claim 1, wherein the memory array in which the memory transistors are arranged in the form of a matrix exhibits a NAND type structure in which a plurality of memory transistors are connected in series.

4. A semiconductor nonvolatile memory device as set forth in claim 1, wherein the memory array in which the memory transistors are arranged in the form of a matrix exhibits a NOR type structure and in which the main bit lines are classified into a plurality of sub-bit lines via an operative connecting means.

5. A semiconductor nonvolatile memory device, comprising:

a plurality of memory transistors in which data is electrically programmed in units of pages by performing the data programming together for all memory transistors of a sector selected in response to page program data in units of sectors are arranged in the form matrix;

a first data latch circuit and a second data latch circuit provided for every bit line and forming a pair each other;

a means for continuously inputting the page program data of a plurality of page areas by alternately dividing the same into first page program data and second page program data;

a first page data programming means for transferring the first page program data to the first data latch circuit and performing the page programming according to the data latched in the first data latch circuit;

a second page data programming means for transferring the second page program data to the second data latch circuit and performing the page programming according to the data latched in the second data latch circuit; and a means for repeatedly performing the data programming operation of the first page data programming means and the data programming operation of the second page data programming means in parallel to each other.

6. A semiconductor nonvolatile memory device as set forth in claim 5, wherein the sector unit is the word line unit.

7. A semiconductor nonvolatile memory device as set forth in claim 5, wherein the input of the page program data of a plurality of page areas is continuously carried out in synchronization with a constant clock pulse.

8. A semiconductor nonvolatile memory device as set forth in claim 5, wherein the first data latch circuit and the second data latch circuit are arranged separated to the two sides of the memory array in the bit line direction.

9. A semiconductor nonvolatile memory device as set forth in claim 5, wherein the memory array in which the memory transistors are arranged in the form of a matrix exhibits a NAND type structure in which a plurality of memory transistors are connected in series.

10. A semiconductor nonvolatile memory device as set forth in claim 5, wherein the memory array in which the memory transistors are arranged in the form of a matrix exhibits a NOR type structure and in which the main bit lines are classified into a plurality of sub-bit lines via an operative connecting means.

11. A semiconductor nonvolatile memory device, comprising:

a plurality of memory transistors in which data is electrically programmed in units of pages by performing the data programming together for all memory transistors of a sector selected in response to page program data in units of sectors are arranged in the form matrix;

a first bit line and a second bit line alternately arranged in the form of columns while forming a pair with each other;

a first data latch circuit provided for every first bit line and a second data latch circuit provided for every second bit line;

a means for continuously inputting the page program data of a plurality of page areas by alternately dividing the same into first page program data and second page program data;

a first page data programming means for transferring the first page program data to the first data latch circuit and performing the page programming according to the data latched in the first data latch circuit;

a second page data programming means for transferring the second page program data to the second data latch circuit and performing the page programming according to the data latched in the second data latch circuit; and a means for repeatedly performing the data programming operation of the first page data programming means and the data programming operation of the second page data programming means in parallel to each other.

12. A semiconductor nonvolatile memory device as set forth in claim 11, wherein the sector unit is a word line unit.

13. A semiconductor nonvolatile memory device as set forth in claim 11, further provided with a means for setting the second bit line to a program inhibition voltage in an operation for performing the data programming of the first page program data and setting the first bit line to the program inhibition voltage in the operation for performing the data programming of the second page program data.

14. A semiconductor nonvolatile memory device as set forth in claim 11, wherein the input of the page program data of a plurality of page areas is continuously carried out in synchronization with a constant clock pulse.

15. A semiconductor nonvolatile memory device as set forth in claim 11, wherein the first data latch circuit and the second data latch circuit are arranged separated to the two sides of the memory array in the bit line direction.

16. A semiconductor nonvolatile memory device as set forth in claim 11, wherein the memory array in which the memory transistors are arranged in the form of a matrix exhibits a NAND type structure in which a plurality of memory transistors are connected in series.

17. A semiconductor nonvolatile memory device as set forth in claim 11, wherein the memory array in which the memory transistors are arranged in the form of a matrix exhibits a NOR type structure and in which the main bit lines are classified into a plurality of sub-bit lines via an operative connecting means.

* * * * *